United States Patent
Horita et al.

(10) Patent No.: US 10,819,310 B2
(45) Date of Patent: Oct. 27, 2020

(54) RADIO-FREQUENCY FILTER CIRCUIT, MULTIPLEXER, RADIO-FREQUENCY FRONT-END CIRCUIT, AND COMMUNICATION APPARATUS

(71) Applicant: Murata Manufacturing Co., Ltd., Kyoto (JP)

(72) Inventors: Atsushi Horita, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/251,257

(22) Filed: Jan. 18, 2019

(65) Prior Publication Data

US 2019/0158062 A1    May 23, 2019

Related U.S. Application Data

(60) Provisional application No. PCT/JP2017/023707, filed on Jun. 28, 2017.

(30) Foreign Application Priority Data

Jul. 22, 2016 (JP) .................. 2016-144873

(51) Int. Cl.
*H03H 9/64*    (2006.01)
*H03H 7/01*    (2006.01)
(Continued)

(52) U.S. Cl.
CPC ........ *H03H 9/6483* (2013.01); *H03H 7/0161* (2013.01); *H03H 7/075* (2013.01);
(Continued)

(58) Field of Classification Search
CPC .... H03H 9/6483; H03H 7/0161; H03H 7/075; H03H 9/605; H03H 9/6403; H04B 1/0057; H04B 1/40
(Continued)

(56) References Cited

U.S. PATENT DOCUMENTS

| 6,472,953 B1 | 10/2002 | Sakuragawa et al. |
| 2006/0192633 A1 | 8/2006 | Kishimoto et al. |

(Continued)

FOREIGN PATENT DOCUMENTS

| JP | H11-312951 A | 11/1999 |
| JP | 2000-77972 A | 3/2000 |

(Continued)

OTHER PUBLICATIONS

Peter Hess, "Surface Acoustic Waves in Material Science", Physics Today 55, 3, 42, 2002. (Year: 2002).*

(Continued)

*Primary Examiner* — Benny T Lee
*Assistant Examiner* — Hafizur Rahman
(74) *Attorney, Agent, or Firm* — Pearne & Gordon LLP

(57) ABSTRACT

A filter (11) includes a series-arm circuit (10) connected between an input/output terminal (11m) and an input/output terminal (11n); and a parallel-arm circuit (20) connected between a ground and a path that connects the input/output terminal (11m) and the input/output terminal (11n). One circuit among the series-arm circuit (10) and the parallel-arm circuit (20) is constituted by a parallel-arm resonator (p1) and a parallel-arm resonator (p2) that are connected in parallel to each other and that are connected to a node (x1) on the path. The parallel-arm resonators (p1) and (p2) form a pass band, together with another circuit among the series-arm circuit (10) and the parallel-arm circuit (20). The parallel-arm resonator (p2) has a resonant frequency lower (Continued)

than a resonant frequency of the parallel-arm resonator (p1) and has an impedance higher than an impedance of the parallel-arm resonator (p1).

20 Claims, 14 Drawing Sheets

(51) Int. Cl.
  *H04B 1/00* (2006.01)
  *H03H 7/075* (2006.01)
  *H04B 1/40* (2015.01)
  *H03H 9/60* (2006.01)

(52) U.S. Cl.
  CPC .......... *H03H 9/605* (2013.01); *H03H 9/6403* (2013.01); *H04B 1/0057* (2013.01); *H04B 1/40* (2013.01)

(58) Field of Classification Search
  USPC .......................................................... 333/193
  See application file for complete search history.

(56) References Cited

U.S. PATENT DOCUMENTS

| | | |
|---|---|---|
| 2009/0251235 A1 | 10/2009 | Belot et al. |
| 2010/0110940 A1 | 5/2010 | Hara et al. |
| 2014/0169422 A1 | 6/2014 | Hayafuji et al. |
| 2017/0338839 A1* | 11/2017 | Little .................. H04B 1/0458 |

FOREIGN PATENT DOCUMENTS

| | | |
|---|---|---|
| JP | 2000-323961 A | 11/2000 |
| JP | 2014-68123 A | 4/2014 |
| JP | 2016-54374 A | 4/2016 |
| WO | 2004/112246 A1 | 12/2004 |
| WO | 2009/025055 A1 | 2/2009 |
| WO | 2013/027580 A1 | 2/2013 |
| WO | 2017/204346 A1 | 11/2017 |

OTHER PUBLICATIONS

International Search Report for International Application No. PCT/JP2017/023707 dated Sep. 19, 2017.
Written Opinion for International Application No. PCT/JP2017/023707 dated Sep. 19, 2017.

* cited by examiner

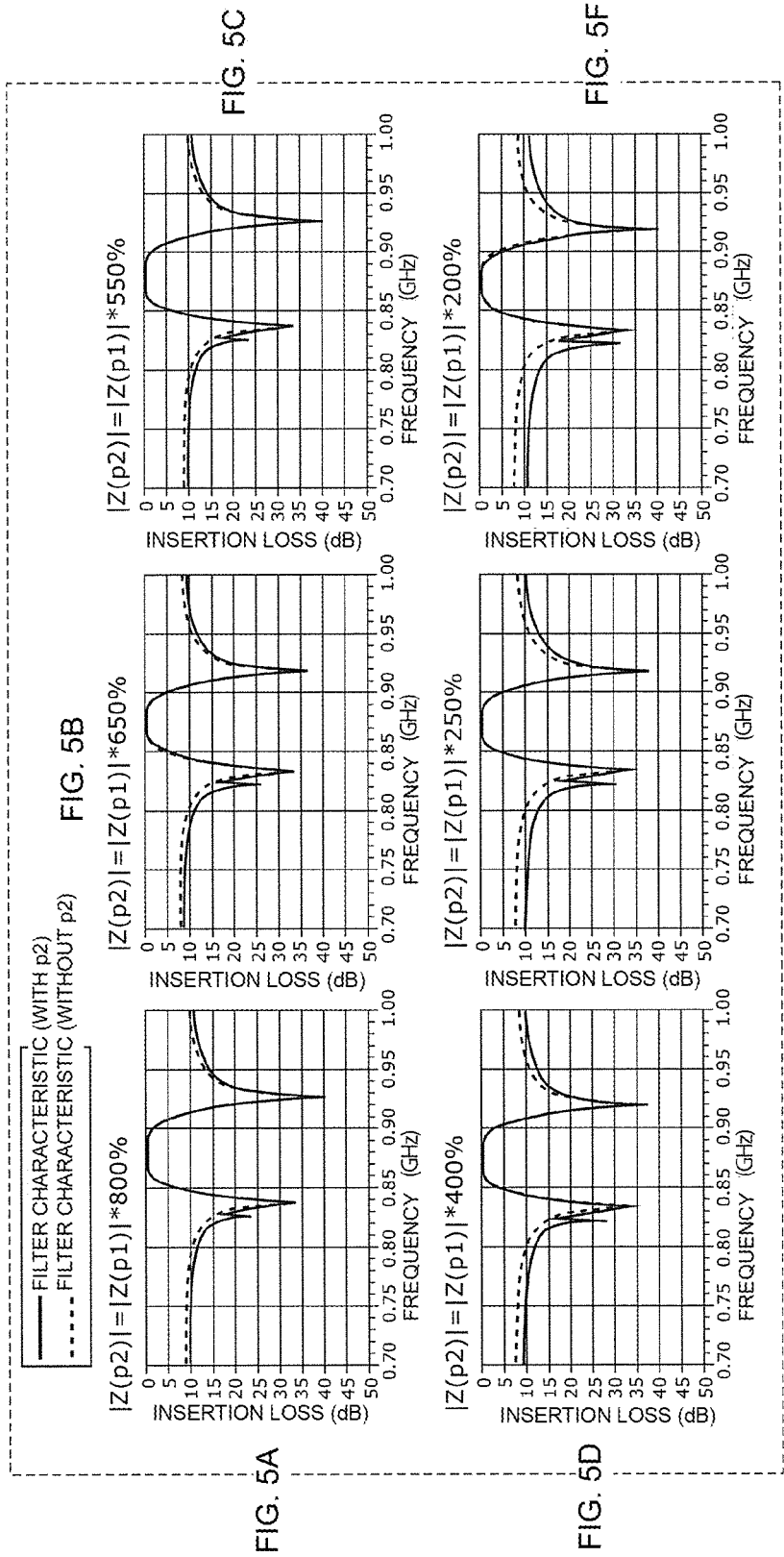

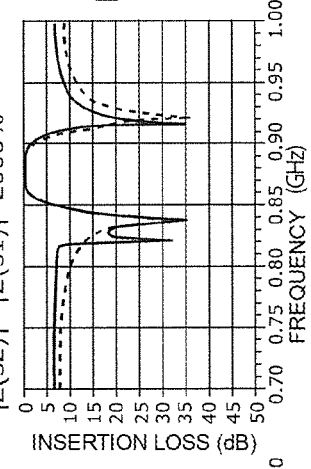
FIG. 9C
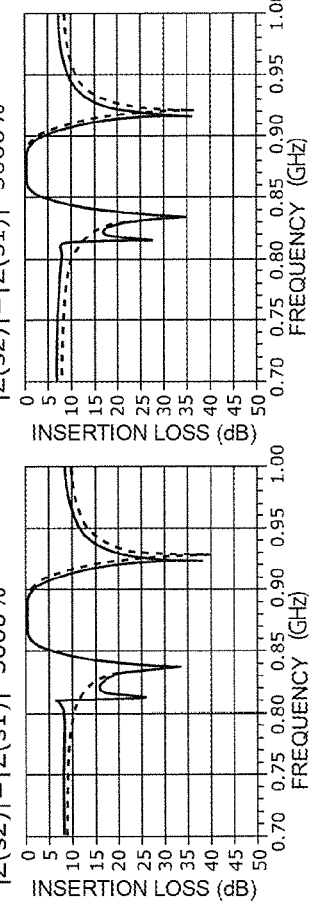
FIG. 9B
FIG. 9A
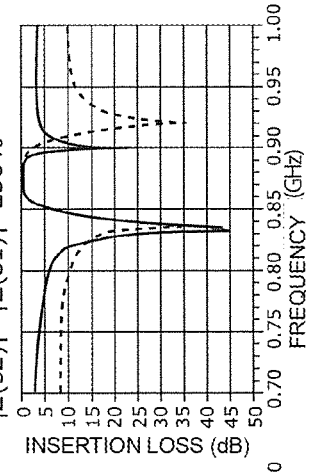
FIG. 9F
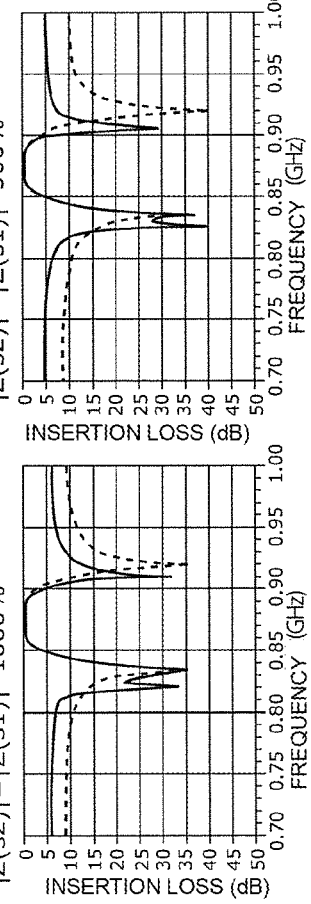
FIG. 9E
FIG. 9D

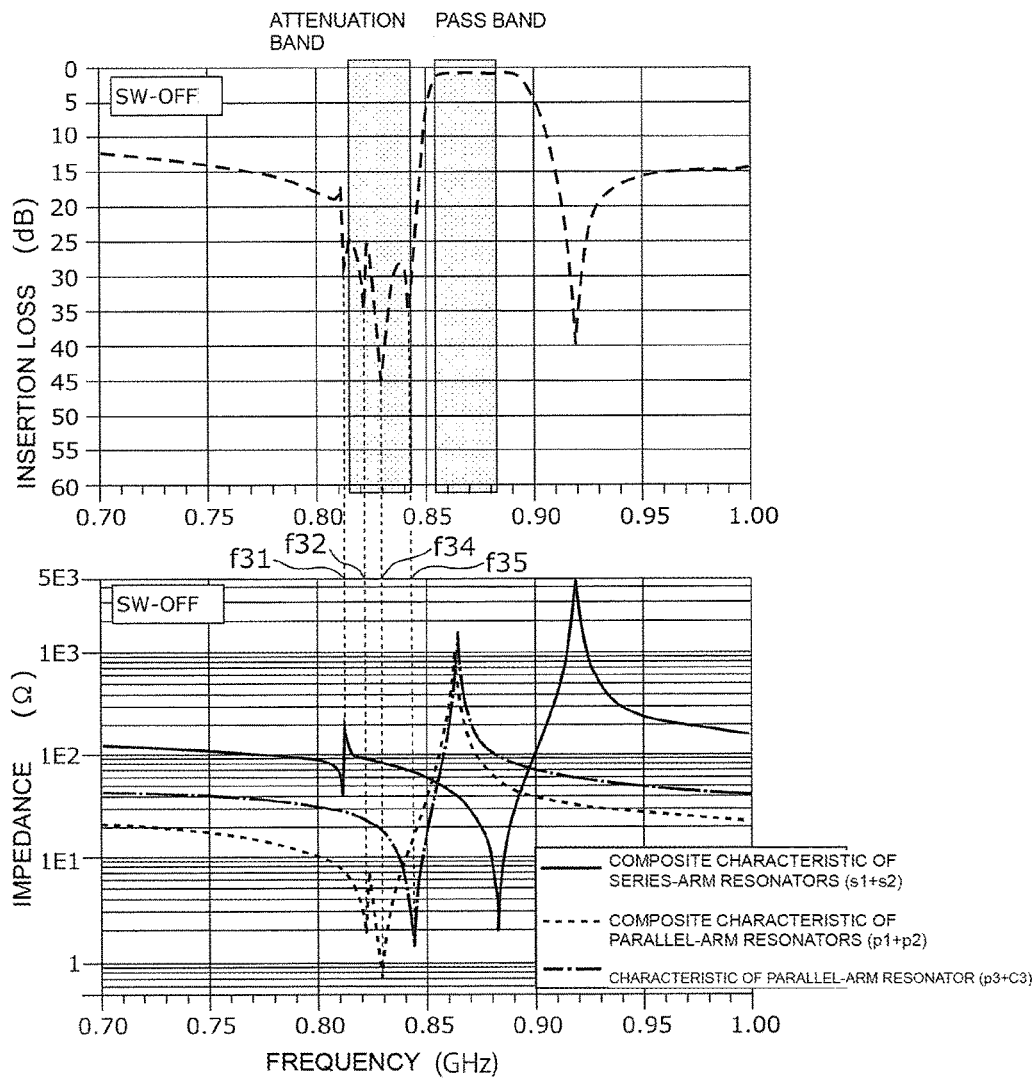

RADIO-FREQUENCY FILTER CIRCUIT, MULTIPLEXER, RADIO-FREQUENCY FRONT-END CIRCUIT, AND COMMUNICATION APPARATUS

This is a continuation of International Application No. PCT/JP2017/023707 filed on Jun. 28, 2017 which claims priority from Japanese Patent Application No. 2016-144873 filed on Jul. 22, 2016. The contents of these applications are incorporated herein by reference in their entireties.

BACKGROUND OF THE DISCLOSURE

Field of the Disclosure

The present disclosure relates to a radio-frequency filter circuit including resonators, a multiplexer, a radio-frequency front-end circuit, and a communication apparatus.

Description of the Related Art

Hitherto, an elastic wave filter using an elastic wave has been widely used for a bandpass filter or the like disposed at a front-end portion of a mobile communication apparatus. In addition, a radio-frequency (RF) front-end circuit including a plurality of elastic wave filters has been put to practical use to support combined functions such as multi-modes and multi-bands.

For example, as an elastic wave filter supporting multi-bands, there has been known a configuration in which one parallel arm connecting a series arm to a ground is provided with a first parallel-arm resonator and a plurality of second parallel-arm resonators connected in parallel to the first parallel-arm resonator while being connected in series to each other (see, for example, Patent Document 1). In such an elastic wave filter, when the resonant frequencies of the plurality of second parallel-arm resonators are set to be higher than the resonant frequencies of a series-arm resonator and other parallel-arm resonators, and the electrostatic capacities of the plurality of second parallel-arm resonators are set to be lower than the electrostatic capacities of the series-arm resonator and the other parallel-arm resonators, the bandwidth of an attenuation band on the high band side of the pass band can be increased.

Patent Document 1: Japanese Unexamined Patent Application Publication No. 2014-68123

BRIEF SUMMARY OF THE DISCLOSURE

However, in the foregoing configuration according to the related art, one parallel arm has only one parallel-arm resonator that forms an attenuation pole on the low band side of the pass band, and thus it is difficult to increase the width of the attenuation band on the low band side of the pass band.

Accordingly, the present disclosure has been made to solve the foregoing problems, and an object of the present disclosure is to provide a radio-frequency filter circuit capable of increasing the bandwidth of an attenuation band on the low band side of the pass band, a multiplexer, a radio-frequency front-end circuit, and a communication apparatus.

To achieve the foregoing object, a radio-frequency filter circuit according to an aspect of the present disclosure includes a series-arm circuit connected between a first input/output terminal and a second input/output terminal; and a parallel-arm circuit connected between a ground and a path that connects the first input/output terminal and the second input/output terminal. One circuit among the series-arm circuit and the parallel-arm circuit is constituted by a first resonator and a second resonator that are connected in parallel to each other and that are connected to a first node on the path. The first resonator and the second resonator form a pass band, together with another circuit among the series-arm circuit and the parallel-arm circuit. The second resonator has a resonant frequency lower than a resonant frequency of the first resonator and has an impedance higher than an impedance of the first resonator.

By using the second resonator having a resonant frequency lower than a resonant frequency of the first resonator and an impedance higher than an impedance of the first resonator, it is possible to form an attenuation pole on the low band side of the pass band at a lower frequency than in the case of not using the second resonator, while suppressing an increase in insertion loss at the higher end of the pass band. Thus, the bandwidth of the attenuation band on the low band side of the pass band can be increased.

The one circuit may be the parallel-arm circuit.

Accordingly, the parallel-arm circuit includes the second resonator having a resonant frequency lower than a resonant frequency of the first resonator and an impedance higher than an impedance of the first resonator. Accordingly, in this aspect, it is possible to form a second attenuation pole formed by the resonant frequency of the second resonator on the low band side of a first attenuation pole formed by the resonant frequency of the first resonator, while suppressing an increase in insertion loss at the higher end of the pass band. Thus, the bandwidth of the attenuation band on the low band side of the pass band can be increased. Furthermore, a frequency interval between a high-band-side frequency at which the composite impedance of the parallel-arm circuit is minimum and a high-band-side frequency at which the composite impedance is maximum can be made narrower than a frequency interval between the resonant frequency and anti-resonant frequency of the first resonator alone. Accordingly, in this aspect, the steepness on the low band side of the pass band can be increased.

The one circuit may be the series-arm circuit.

Accordingly, the series-arm circuit includes the second resonator having a resonant frequency lower than a resonant frequency of the first resonator and an impedance higher than an impedance of the first resonator. Accordingly, in this aspect, it is possible to form an attenuation pole on the low band side of the pass band at a lower frequency than in the case of not using the second resonator, while suppressing an increase in insertion loss at the higher end of the pass band. Thus, the bandwidth of the attenuation band on the low band side of the pass band can be increased. Furthermore, a frequency interval between a high-band-side frequency at which the composite impedance of the series-arm circuit is minimum and a high-band-side frequency at which the composite impedance is maximum can be made narrower than a frequency interval between the resonant frequency and anti-resonant frequency of the first resonator alone. Accordingly, in this aspect, the steepness on the high band side of the pass band can be increased.

The second resonator may have a resonant frequency lower than an anti-resonant frequency of a resonator constituting the other circuit.

Accordingly, a decrease in the amount of attenuation between the attenuation poles on the low band side of the pass band can be suppressed, and thus the attenuation in the attenuation band on the low band side of the pass band can be ensured.

The other circuit may be constituted by a third resonator and a fourth resonator that are connected in parallel to each other and that are connected to the first node. The third resonator and the fourth resonator may form a pass band, together with the one circuit. The fourth resonator may have a resonant frequency lower than a resonant frequency of the third resonator and may have an impedance higher than an impedance of the third resonator.

Since the one circuit is constituted by the first resonator and the second resonator, and the other circuit is constituted by the third resonator and the fourth resonator, further attenuation can be ensured in the attenuation band on the low band side of the pass band. Thus, the bandwidth of the attenuation band on the low band side of the pass band can be further increased.

The one circuit may further include a first impedance element connected in series or parallel to the second resonator. The first resonator, the second resonator, and the first impedance element may form the pass band, together with the other circuit.

Accordingly, by appropriately selecting the first impedance element, it is possible to obtain another filter characteristic while increasing the bandwidth of the attenuation band on the low band side of the pass band.

For example, when a capacitor is provided as the first impedance element connected in parallel to the second resonator, a frequency interval between the resonant frequency and anti-resonant frequency of the second resonator connected to the first impedance element can be made narrower than a frequency interval between the resonant frequency and anti-resonant frequency of the second resonator alone. With this configuration, a steep attenuation characteristic can be obtained.

For example, when an inductor is provided as the first impedance element connected in series to the second resonator, a frequency interval between the resonant frequency and anti-resonant frequency of the second resonator connected to the first impedance element can be made wider than a frequency interval between the resonant frequency and anti-resonant frequency of the second resonator alone. With this configuration, a wide bandpass characteristic can be obtained (the pass band can be widened).

The radio-frequency filter circuit may further include a parallel-arm resonator connected between the ground and a second node different from the first node on the path; and a second impedance element and a switch element that are connected in series to the parallel-arm resonator between the ground and the second node and that are connected in parallel to each other.

Accordingly, it is possible to switch the filter characteristic in accordance with switching between ON and OFF of the switch element, while increasing the bandwidth of the attenuation band on the low band side of the pass band.

The switch element may be a FET switch made of GaAs or CMOS, or a diode switch.

Such a switch element using a semiconductor is compact, and thus the radio-frequency filter circuit can be decreased in size.

The second impedance element may be a variable capacitor or a variable inductor.

Accordingly, in a second filter characteristic when the switch element is OFF, the frequency variable width of an attenuation pole affected by the second impedance element can be finely adjusted. Thus, the bandwidth of the attenuation band on the low band side of the pass band can be increased, and the lower end and higher end of the attenuation band can be finely adjusted.

Each of the series-arm circuit and the parallel-arm circuit may be constituted by an elastic wave resonator that uses a surface acoustic wave, a bulk wave, or a boundary acoustic wave.

Accordingly, the size of each of the series-arm circuit and the parallel-arm circuit can be reduced, and thus the size and cost of the radio-frequency filter circuit can be reduced. In particular, an elastic wave resonator typically has a high Q characteristic, and thus both lower loss and higher degree of freedom for selection (suppression of mutual interference with an adjoining band) can be achieved.

A multiplexer according to an aspect of the present disclosure includes a plurality of radio-frequency filter circuits including the foregoing radio-frequency filter circuit.

Accordingly, in the multiplexer applied to a system supporting multi-bands, the bandwidth of the attenuation band on the low band side of the pass band can be increased.

A radio-frequency front-end circuit according to an aspect of the present disclosure includes the foregoing radio-frequency filter circuit; and a switch circuit that is provided in a preceding stage or a subsequent stage of the plurality of radio-frequency filter circuits and that includes a plurality of selection terminals individually connected to the plurality of radio-frequency filter circuits and a common terminal selectively connected to the plurality of selection terminals.

Accordingly, some of the signal paths through which radio-frequency signals are transmitted can be used in common. Accordingly, for example, an amplifier circuit or the like for the plurality of radio-frequency filter circuits can be used in common, and thus the size and cost of the radio-frequency front-end circuit can be reduced.

A communication apparatus according to an aspect of the present disclosure includes a radio-frequency signal processing circuit that processes a radio-frequency signal transmitted or received by an antenna element; and the foregoing radio-frequency front-end circuit that transmits the radio-frequency signal between the antenna element and the radio-frequency signal processing circuit.

Accordingly, the communication apparatus supporting multi-bands can be simplified and reduced in size.

In the radio-frequency filter circuit and so forth according to the present disclosure, the bandwidth of an attenuation band on the low band side of the pass band can be increased.

BRIEF DESCRIPTION OF THE SEVERAL VIEWS OF THE DRAWINGS

FIGS. 5A to 5F include graphs illustrating characteristics in various impedance ratios according to the first embodiment.

FIGS. 9A to 9F include graphs illustrating characteristics in various impedance ratios according to the first modification example of the first embodiment.

FIGS. 11A and 11B include graphs illustrating the characteristics of the filter according to the second modification example of the first embodiment when a switch is ON.

FIGS. 11C and 11D include graphs illustrating the characteristics of the filter according to the second modification example of the first embodiment when the switch is OFF.

DETAILED DESCRIPTION OF THE DISCLOSURE

Figure 1:
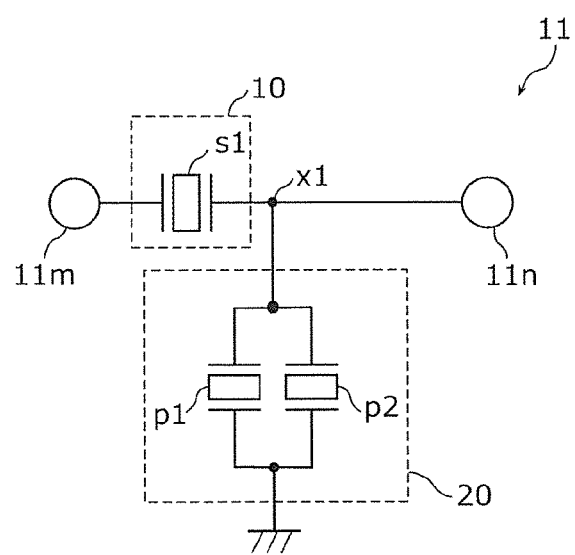
FIG. 1 is a circuit configuration diagram of a filter according to a first embodiment.

Hereinafter, embodiments of the present disclosure will be described in detail by using the examples and the drawings. Each of the embodiments described below illustrates general or specific examples. The values, shapes, materials, components, arrangement and connection style of the components, and the like described in the following embodiments are merely examples and do not limit the present disclosure. Among the components described in the following embodiments, a component that is not described in an independent claim will be described as an optional component. The sizes of the components illustrated in the drawings or the ratio of sizes are not always strict. In the individual figures, the components that are substantially the same are denoted by the same numerals, and a duplicate description will be omitted or simplified.

First Embodiment

[1. Circuit Configuration of Filter]

FIG. 1 is a circuit configuration diagram of a filter 11 according to a first embodiment.

The filter 11 is, for example, a radio-frequency (RF) filter circuit that is disposed at a front-end portion of a cellular phone supporting multi-modes and multi-bands. The filter 11 is, for example, a bandpass filter that is built in a cellular phone supporting multi-bands used in Long Term Evolution (LTE) or the like and that passes an RF signal of a predetermined band.

As illustrated in FIG. 1, the filter 11 includes a series-arm resonator s1 constituting a series-arm circuit 10 and parallel-arm resonators p1 and p2 constituting a parallel-arm circuit 20. Specifically, in the filter 11, one of the series-arm circuit 10 and the parallel-arm circuit 20 (in the present embodiment, the parallel-arm circuit 20) is constituted by a first resonator (in the present embodiment, the parallel-arm resonator p1) and a second resonator (in the present embodiment, the parallel-arm resonator p2) that are connected in parallel to each other and that are connected to the same node x1 (first node) of the series arm. In the present embodiment, the node x1 is located between the series-arm circuit 10 and an input/output terminal 11n, but may be located between the series-arm circuit 10 and an input/output terminal 11m.

The series-arm resonator s1 is connected between the input/output terminal 11m, which is an example of a first input/output terminal, and the input/output terminal 11n, which is an example of a second input/output terminal. That is, the series-arm resonator s1 is a resonator provided on the series arm that connects the input/output terminal 11m and the input/output terminal 11n. The series-arm resonator s1 forms, together with one of the series-arm circuit 10 and the parallel-arm circuit 20 (here, the parallel-arm circuit 20), the pass band of the filter 11 and an attenuation pole on the high band side of the pass band.

The parallel-arm resonator p1 is the first resonator that is connected between the ground (reference terminal) and the node x1 on a path that connects the input/output terminal 11m and the input/output terminal 11n and that has a first resonant frequency and a first impedance.

The parallel-arm resonator p2 is the second resonator that is connected between the ground (reference terminal) and the node x1 on the path that connects the input/output terminal 11m and the input/output terminal 11n and that has a second resonant frequency lower than the first resonant frequency and a second impedance higher than the first impedance.

Here, an impedance |Z| of a resonator is expressed as $|Z|=|1/(j\omega C)|$ by using an electrostatic capacity C of the resonator. Here, the electrostatic capacity C is a static capacity in an equivalent circuit of the resonator (equivalent capacity). That is, the electrostatic capacity C is a capacitance when the resonator operates as a capacitor without being excited. That is, the electrostatic capacity C of the resonator is a capacitance component that is formed by a dielectric substrate between an electrode connected to one of the terminals of the resonator and an electrode connected to the other terminal.

The node x1 to which the parallel-arm resonator p1 is connected and the node x1 to which the parallel-arm resonator p2 is connected are the same (first node). That is, the "same node" includes not only one point on a transmission line but also two different points on the transmission line that are located with a resonator or impedance element not interposed therebetween.

The parallel-arm resonators p1 and p2 constitute the parallel-arm circuit 20 connected between the ground and the node x1 on the path (on the series arm) that connects the input/output terminal 11m and the input/output terminal 11n. That is, the parallel-arm circuit 20 is provided on one parallel arm that connects the series arm and the ground.

Accordingly, the filter 11 has a ladder filter structure constituted by the one series-arm circuit 10 constituted by the series-arm resonator s1 and the one parallel-arm circuit 20 constituted by the two parallel-arm resonators p1 and p2 connected in parallel to each other.

That is, the two resonators constituting one of the series-arm circuit 10 and the parallel-arm circuit 20 (in the present embodiment, the parallel-arm resonators p1 and p2 constituting the parallel-arm circuit 20) form, together with the other circuit (here, the series-arm circuit 10), the pass band of the filter 11.

[2. Resonator Structure]

Next, a description will be given of the structures of the individual resonators constituting the filter 11 (the series-arm resonator s1 and the parallel-arm resonators p1 and p2). In the present embodiment, these resonators are elastic wave resonators using a surface acoustic wave. Accordingly, the filter 11 can be constituted by interdigital transducer (IDT) electrodes formed on a piezoelectric substrate, and thus a compact and low-profile RF filter circuit having a bandpass characteristic with a high degree of steepness can be obtained. Each resonator is not limited to an elastic wave resonator using a surface acoustic wave, and may be an elastic wave resonator using a bulk wave or a boundary acoustic wave. An elastic wave resonator typically has a high Q characteristic, and thus both lower loss and higher degree of freedom for the selection (the suppression of the mutual interference with an adjoining band) can be achieved.

Figure 2:
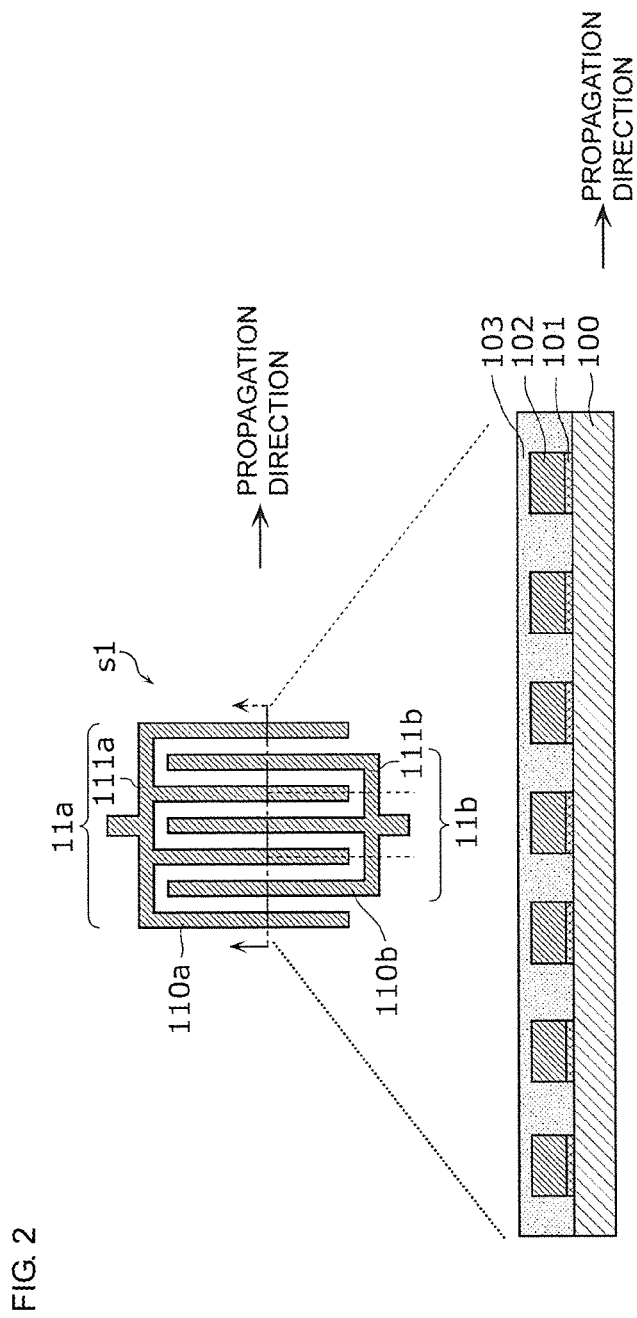
FIG. 2 is an example of a plan view and a cross-sectional view that schematically illustrate each resonator of the filter according to the first embodiment.

FIG. 2 is an example of a plan view and a cross-sectional view that schematically illustrate each resonator of the filter 11 according to the first embodiment. FIG. 2 includes a schematic plan view and a schematic cross-sectional view illustrating the structure of the series-arm resonator s1 among the resonators constituting the filter 11. The series-arm resonator s1 illustrated in FIG. 2 is for describing the typical structures of the foregoing plurality of resonators, and the number and lengths of electrode fingers constituting an electrode are not limited thereto.

Each resonator of the filter 11 is constituted by a piezoelectric substrate 100 and IDT electrodes 11a and 11b each having a comb shape.

As illustrated in the plan view in FIG. 2, a pair of the IDT electrodes 11a and 11b facing each other are formed on the substrate 100. The IDT electrode 11a is constituted by a plurality of electrode fingers 110a that are parallel with each other and a busbar electrode 111a that connects the plurality of electrode fingers 110a. Also, the IDT electrode 11b is constituted by a plurality of electrode fingers 110b that are parallel with each other and a busbar electrode 111b that connects the plurality of electrode fingers 110b. The plurality of electrode fingers 110a and 110b are formed along a direction orthogonal to a propagation direction.

The IDT electrodes 11a and 11b constituted by the plurality of electrode fingers 110a and 110b and the busbar electrodes 111a and 111b have a multilayer structure including an adhesive layer 101 and a main electrode layer 102, as illustrated in the cross-sectional view in FIG. 2.

The adhesive layer 101 is a layer for increasing the adhesion between the substrate 100 and the main electrode layer 102, and Ti is used as the material thereof, for example. The adhesive layer 101 has a film thickness of 12 nm, for example.

For the main electrode layer 102, Al containing 1% Cu is used as the material, for example. The main electrode layer 102 has a film thickness of 162 nm, for example.

A protective layer 103 covers the IDT electrodes 11a and 11b. The protective layer 103 is a layer for protecting the main electrode layer 102 from an external environment, adjusting frequency and temperature characteristics, and increasing moisture resistance, and is, for example, a film mainly containing silicon dioxide.

The materials of the adhesive layer 101, the main electrode layer 102, and the protective layer 103 are not limited to the above-described materials. Furthermore, the IDT electrodes 11a and 11b need not necessarily have the foregoing multilayer structure. The IDT electrodes 11a and 11b may be made of, for example, a metal such as Ti, Al, Cu, Pt, Au, Ag, or Pd, or an alloy thereof, or may be formed of a plurality of multilayer bodies made of the foregoing metal or alloy. The protective layer 103 is not always necessarily.

The substrate 100 is piezoelectric and is made of, for example, a $LiTaO_3$ piezoelectric single crystal, a $LiNbO_3$ piezoelectric single crystal, a $KNbO_3$ piezoelectric single crystal, quartz, or piezoelectric ceramics.

The resonator having such a configuration has a "resonant point", which is a singular point at which the impedance is minimum (ideally a point at which the impedance is 0), and an "anti-resonant point", which is a singular point at which the impedance is maximum (ideally a point at which the impedance is infinite).

The structure of each resonator included in the filter 11 is not limited to the structure illustrated in FIG. 2. For example, the IDT electrodes 11a and 11b may have a single-layer structure of a metallic film, instead of the multilayer structure of metallic films.

[3. Filter Characteristic]

The filter 11 having the above-described configuration forms a second filter characteristic (second bandpass characteristic) in which the attenuation band on the low band side of the pass band is wider than in a first filter characteristic (first bandpass characteristic) formed by only the series-arm resonator s1 and the parallel-arm resonator p1, without the parallel-arm resonator p2. Hereinafter, a description will be given of the filter characteristic of the filter 11 according to the present embodiment.

Hereinafter, a singular point at which the impedance is minimum (ideally a point at which the impedance is 0) will be referred to as a "resonant point", and the frequency at the resonant point will be referred to as a "resonant frequency", not only in a resonator alone but also in a circuit constituted by a plurality of resonators (a series-arm circuit or parallel-arm circuit) for convenience. Also, a singular point at which the impedance is maximum (ideally a point at which the impedance is infinite) will be referred to as an "anti-resonant point", and the frequency at the anti-resonant point will be referred to as an "anti-resonant frequency".

Figure 3A:
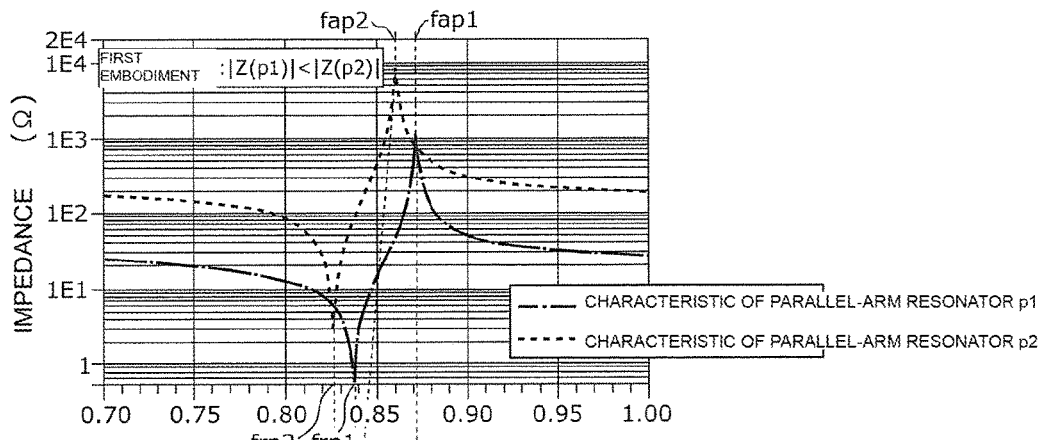
FIGS. 3A, 3B and 3C include graphs illustrating the characteristics of the filter according to the first embodiment.
Figure 3B:
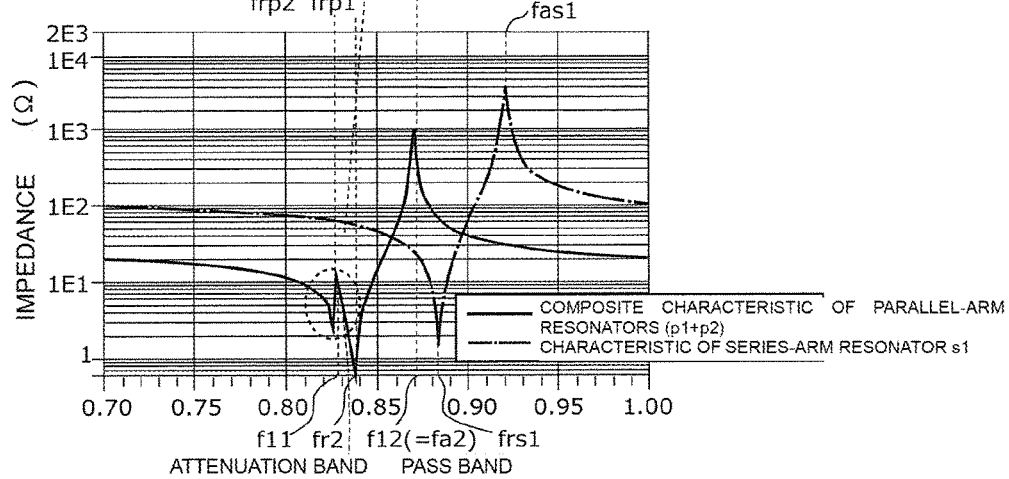
Figure 3C:
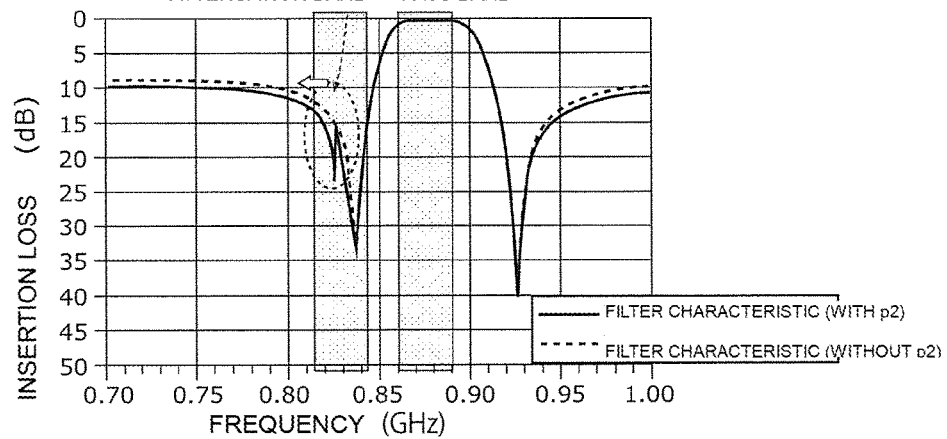

FIGS. 3A, 3B and 3C include graphs illustrating the characteristics of the filter 11 according to the first embodiment. Specifically, FIG. 3A is a graph illustrating the impedance characteristics of the parallel-arm resonators p1 and p2. FIG. 3B is a graph illustrating the composite impedance characteristic (composite characteristic) of the parallel-arm resonators p1 and p2. FIG. 3C is a graph illustrating the comparison between the filter characteristic of the filter 11 (second filter characteristic, "filter characteristic (with p2)" in the figure) and a filter characteristic when the parallel-arm resonator p2 is not included (first filter characteristic, "filter characteristic (without p2)" in the figure).

First, the impedance characteristic of a resonator alone will be described with reference to FIG. 3A.

As illustrated in FIG. 3A, the parallel-arm resonator p1 and the parallel-arm resonator p2 have the following impedance characteristics. Specifically, the parallel-arm resonator p1 has a resonant frequency frp1 and an anti-resonant frequency fap1 (at this time, frp1<fap1 is satisfied). The parallel-arm resonator p2 has a resonant frequency frp2 and an anti-resonant frequency fap2 (at this time, frp2<frp1 and frp2<fap2 are satisfied). In addition, the series-arm resonator s1 has a resonant frequency frs1 and an anti-resonant frequency fas1 (at this time, frs1<fas1). In addition, an impedance |Z(p1)| of the parallel-arm resonator p1 and an impedance |Z(p2)| of the parallel-arm resonator p2 satisfy |Z(p1)|<|Z(p2)|.

Next, a description will be given of the composite characteristic of the parallel-arm resonator p1 and the parallel-arm resonator p2 (i.e., the impedance characteristic of the parallel-arm circuit 20).

As illustrated in FIG. 3B, the composite characteristic of the two parallel-arm resonators p1 and p2 ("composite characteristic of parallel-arm resonators (p1+p2)" in FIG. 3B) is minimum at the resonant frequency frp2 of the parallel-arm resonator p2 and the resonant frequency frp1 of the parallel-arm resonator p1. In addition, the composite characteristic is maximum at a frequency f11 between the two resonant frequencies frp2 and frp1 and at a frequency f12 between the two anti-resonant frequencies fap2 and fap1.

In the case of configuring a bandpass filter having a ladder filter structure, an anti-resonant frequency of a parallel-arm circuit and a resonant frequency of a series-arm circuit are set to be close to each other. In the present embodiment, the frequency f12, which is the higher anti-resonant frequency of the two anti-resonant frequencies of the parallel-arm circuit 20, and the resonant frequency frs1 of the series-arm resonator s1 constituting the series-arm circuit 10 are set to be close to each other, thereby forming a pass band. In other words, the parallel-arm resonators p1 and p2 form, together with the series-arm circuit 10 (here, the series-arm resonator s1), the pass band of the filter 11.

Accordingly, as illustrated in FIG. 3C, an attenuation band including frp2 and frp1 as attenuation poles is formed on the low band side of the pass band, and an attenuation band including fas1 as an attenuation pole is formed on the high band side of the pass band.

Here, as described above, the parallel-arm resonator p2, which is the second resonator in the present embodiment, has a resonant frequency lower than that of the parallel-arm resonator p1, which is the first resonator in the present embodiment (i.e., frp2<frp2). Thus, in the filter characteristic of the filter 11 including the parallel-arm resonator p2, the attenuation band on the low band side of the pass band is wider than in the filter characteristic when the parallel-arm resonator p2 is not included.

Specifically, a filter not including the parallel-arm resonator p2 has only a first attenuation pole (frequency frp1) that is formed by the resonant point of the parallel-arm resonator p1. In such a filter, the amount of attenuation decreases on the low band side of the first attenuation pole, and thus there is a possibility that sufficient attenuation is not ensured within the attenuation band.

In contrast, the filter 11 according to the present embodiment including the parallel-arm resonator p2 has a second attenuation pole (frequency frp2) that is formed by the resonant point of the parallel-arm resonator p2, on the low band side of the first attenuation pole (frequency frp1). Thus, compared with the filter not including the parallel-arm resonator p2, the filter 11 according to the present embodiment is able to maintain the amount of attenuation on the low band side of the first attenuation pole by using the second attenuation pole, and is thus able to ensure sufficient attenuation within the attenuation band.

In addition, as described above, the parallel-arm resonator p2 serving as the second resonator has an impedance higher than that of the parallel-arm resonator p1 serving as the first resonator. Accordingly, the filter 11 is able to widen the attenuation band on the low band side of the pass band and to increase the steepness on the low band side of the pass band, while suppressing an increase in insertion loss at the higher end of the pass band. Specifically, with this configuration, a frequency interval |fr2−fa2| between a high-band-side frequency (high-band-side resonant frequency fr2) at which the impedance of the parallel-arm circuit 20 (here, the composite impedance of the parallel-arm resonators p1 and p2) is minimum and a high-band-side frequency (high-band-side anti-resonant frequency fa2) at which the impedance of the parallel-arm circuit 20 is maximum can be made narrower than a frequency interval |frp1−fap1| between the resonant frequency frp1 and the anti-resonant frequency fap1 of the parallel-arm resonator p1 alone. Accordingly, in the present embodiment, the steepness on the low band side of the pass band can be increased. This will be described below by using a filter according to a first comparative example.

The filter according to the first comparative example has the same configuration as the filter 11 according to the first embodiment except that the filter includes a parallel-arm resonator p2 that satisfies $|Z(p1)|\geq|Z(p2)|$.

Figure 4A:
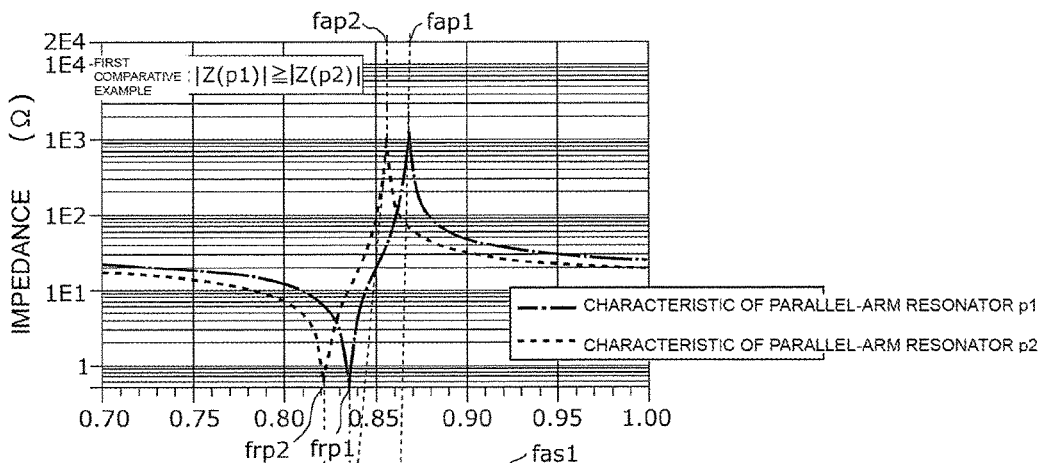
FIGS. 4A, 4B and 4C include graphs illustrating the characteristics of a filter according to a first comparative example.
Figure 4B:
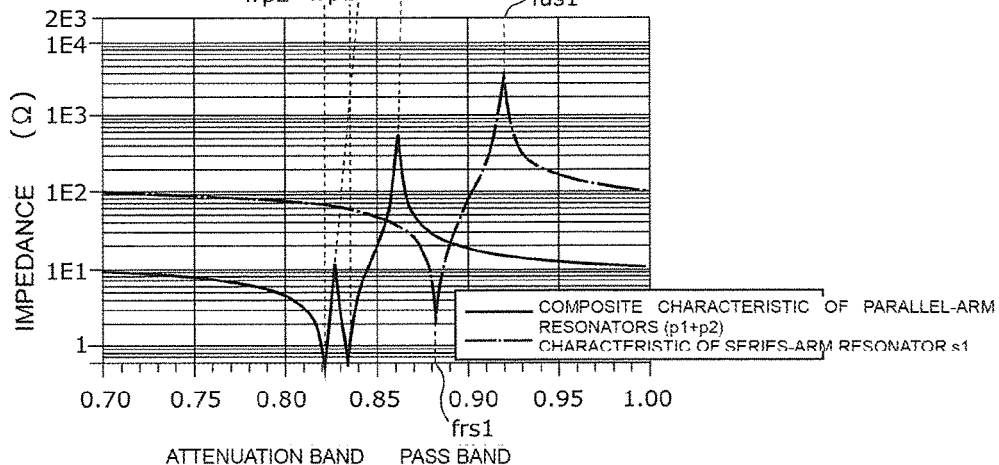
Figure 4C:
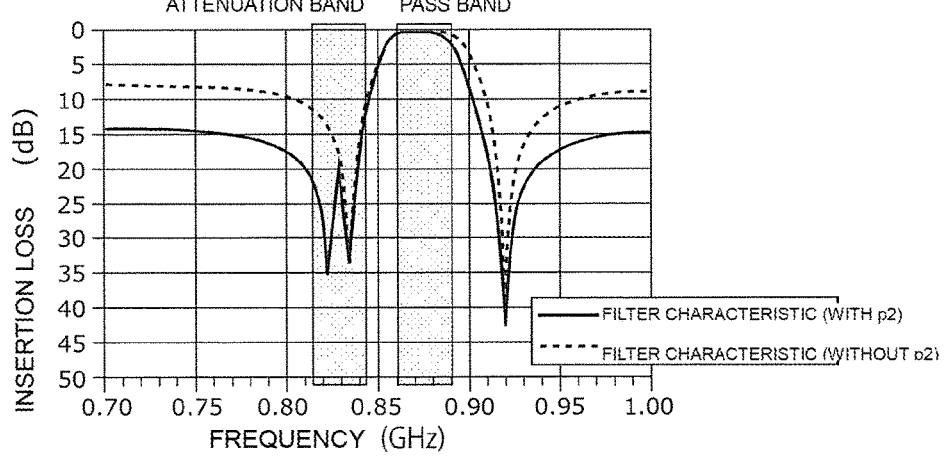

FIGS. 4A, 4B and 4C include graphs illustrating the characteristics of the filter according to the first comparative example. Specifically, FIGS. 4A to 4C are graphs illustrating individual characteristics of the filter according to the first comparative example, like FIGS. 3A to 3C.

As illustrated in FIG. 4A, $|Z(p1)|\geq|Z(p2)|$ (in FIG. 4A, $|Z(p1)|>|Z(p2)|$) is satisfied in the first comparative example, unlike in the first embodiment.

As is clear from the comparison between FIG. 4B and FIG. 3B, in the composite characteristic, the impedance ratio (|Z| ratio) between the two resonant points and the anti-resonant point between the two resonant points (i.e., the anti-resonant point on the low band side) is larger in the first comparative example than in the first embodiment.

Thus, as illustrated in FIG. 4C, the amount of attenuation at the second attenuation pole (frequency frp2) formed by the resonant point of the parallel-arm resonator p2 is larger in the first comparative example than in the first embodiment. At this time, however, on the high band side of the pass band, the insertion loss at the higher end of the pass band is larger in the first comparative example than in the first embodiment, which may result in another problem of larger in-band loss. This is because, in the composite characteristic (see FIG. 4B), the frequency of the high-band-side anti-resonant point is lower and the pass band width is smaller in the first comparative example than in the first embodiment.

In contrast, in the filter 11 according to the first embodiment, $|Z(p1)|<|Z(p2)|$ is satisfied, and thus it is possible to increase the bandwidth of the attenuation band on the low band side of the pass band while suppressing an increase in insertion loss at the higher end of the pass band.

FIGS. 5A to 5F include graphs illustrating the comparisons between the characteristics of the filter 11 according to the first embodiment with various impedance ratios of the parallel-arm resonator p2 to the parallel-arm resonator p1 and the characteristics of the filter not including the parallel-arm resonator p2. Specifically, FIGS. 5A to 5F are graphs illustrating the characteristics when $|Z(p2)|$ is 800%, 650%, 550%, 400%, 250%, and 200% of $|Z(p1)|$, as denoted at the top of the individual graphs.

As illustrated in FIGS. 5A to 5F, on the low band side of the pass band, the amount of attenuation between the attenuation poles on the low band side of the pass band decreases in the filter characteristic as the impedance ratio of the parallel-arm resonator p2 to the parallel-arm resonator p1 decreases. This is because the impedance ratio between the two resonant points and the anti-resonant point therebetween increases in the composite impedance characteristic of the parallel-arm resonators p1 and p2. However, the frequency of each attenuation pole is not changed even when the impedance ratio decreases. That is, even when the impedance ratio decreases, the second attenuation pole (frequency frp2) can be formed on the low band side of the first attenuation pole (frequency frp1) when frp2<frp1 is satisfied. Accordingly, the bandwidth of the attenuation band on the low band side of the pass band can be increased.

As illustrated in FIGS. 5A to 5F, on the high band side of the pass band, it is understood that the insertion loss at the higher end of the pass band is suppressed compared with the first comparative example when |Z(p1)|<|Z(p2)| is satisfied even when the impedance ratio decreases.

Thus, the resonant frequency frp2 of the parallel-arm resonator p2 and the impedance ratio of the parallel-arm resonator p2 to the parallel-arm resonator p1 may be appropriately determined in consideration of the filter characteristics required for the filter 11 (the bandwidth and in-band loss of the pass band, the bandwidth and in-band attenuation of the attenuation band, and so forth).

[4. Advantages and the Like]

As described above, in the filter 11 according to the present embodiment, one of the series-arm circuit 10 and the parallel-arm circuit 20 (in the present embodiment, the parallel-arm circuit 20) is constituted by the first resonator (in the present embodiment, the parallel-arm resonator p1) and the second resonator (in the present embodiment, the parallel-arm resonator p2). Here, the second resonator has a resonant frequency lower than that of the first resonator and also has an impedance higher than that of the first resonator. Accordingly, it is possible to form an attenuation pole on the low band side of the pass band at a lower frequency than in the case of not using the second resonator, while suppressing an increase in insertion loss at the higher end of the pass band. Thus, in the filter 11 according to the present embodiment, the bandwidth of the attenuation band on the low band side of the pass band can be increased.

Specifically, in the present embodiment, the one circuit is the parallel-arm circuit 20. That is, according to the present embodiment, the parallel-arm circuit 20 includes the parallel-arm resonator p2 (second resonator) that has the resonant frequency frp2 lower than the resonant frequency frp1 of the parallel-arm resonator p1 (first resonator) and has the impedance |Z(p2)| higher than the impedance |Z(p1)| of the parallel-arm resonator p1. Accordingly, the filter 11 is able to form the second attenuation pole formed by the resonant frequency frp2 of the parallel-arm resonator p2 on the low band side of the first attenuation pole formed by the resonant frequency frp1 of the parallel-arm resonator p1 while suppressing an increase in insertion loss at the end of the pass band. Accordingly, the bandwidth of the attenuation band on the low band side of the pass band can be increased.

First Modification Example of First Embodiment

In the first embodiment, the parallel-arm circuit 20 is constituted by the first resonator and the second resonator. Alternatively, the series-arm circuit, not the parallel-arm circuit, may have such a configuration. Hereinafter, such a filter will be described as a filter according to a first modification example of the first embodiment.

Figure 6:
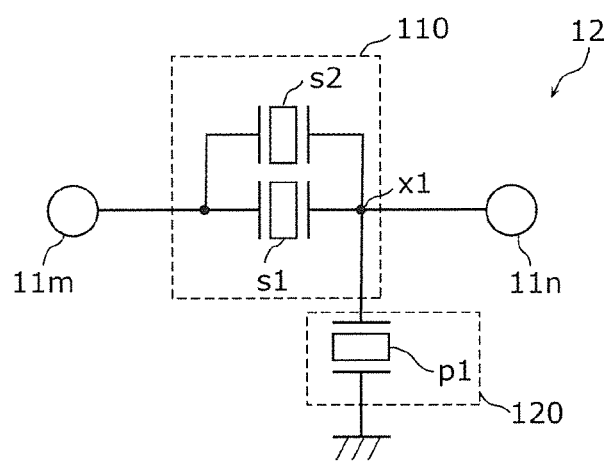
FIG. 6 is a circuit configuration diagram of a filter according to a first modification example of the first embodiment.

FIG. 6 is a circuit configuration diagram of a filter 12 according to the first modification example of the first embodiment.

The filter 12 illustrated in FIG. 6 is different from the filter 11 illustrated in FIG. 1 in the configurations of a series-arm circuit 110 and a parallel-arm circuit 120. As illustrated in FIG. 6, the filter 12 includes series-arm resonators s1 and s2 constituting the series-arm circuit 110 and a parallel-arm resonator p1 constituting the parallel-arm circuit 120. Specifically, in the filter 12, one of the series-arm circuit 110 and the parallel-arm circuit 120 (in the present modification example, the series-arm circuit 110) is constituted by a first resonator (in the present modification example, the series-arm resonator s1) and a second resonator (in the present modification example, the series-arm resonator s2) that are connected in parallel to each other and that are connected to the same node x1 (first node) of a series arm. The series-arm resonator s1 and the parallel-arm resonator p1 are the same as those in the first embodiment, and thus the description of the detailed configuration thereof will be given in a simplified manner.

The series-arm resonator s1 is a resonator having a third resonant frequency and a third impedance.

The series-arm resonator s2 is connected in parallel to the series-arm resonator s1 between the input/output terminal 11m, which is an example of the first input/output terminal, and the input/output terminal 11n, which is an example of the second input/output terminal. That is, the series-arm resonator s2 is a resonator provided on the series arm that connects the input/output terminal 11m and the input/output terminal 11n. The series-arm resonator s2 is a resonator having a fourth resonant frequency lower than the third resonant frequency and a fourth impedance higher than the third impedance.

Accordingly, the filter 12 has a ladder filter structure constituted by the one series-arm circuit 110 constituted by the two series-arm resonators s1 and s2 connected in parallel to each other and the one parallel-arm circuit 120 constituted by the parallel-arm resonator p1.

That is, the two resonators constituting one of the series-arm circuit 110 and the parallel-arm circuit 120 (in the present modification example, the series-arm resonators s1 and s2 constituting the series-arm circuit 110) form, together with the other circuit (in the present modification example, the parallel-arm circuit 120), the pass band of the filter 12.

The filter 12 having the above-described configuration forms the second bandpass characteristic (second filter characteristic) in which the attenuation band on the low band side of the pass band is wider than in the first bandpass characteristic (first filter characteristic) formed by only the series-arm resonator s1 and the parallel-arm resonator p1, without the series-arm resonator s2. Hereinafter, a description will be given of the filter characteristic of the filter 12 according to the present modification example.

Figure 7A:
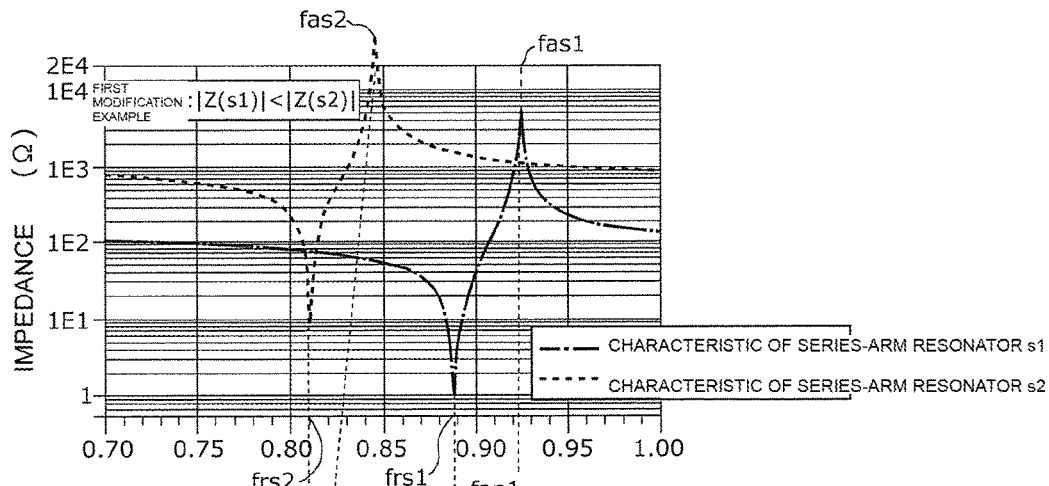
FIGS. 7A, 7B and 7C include graphs illustrating the characteristics of the filter according to the first modification example of the first embodiment.
Figure 7B:
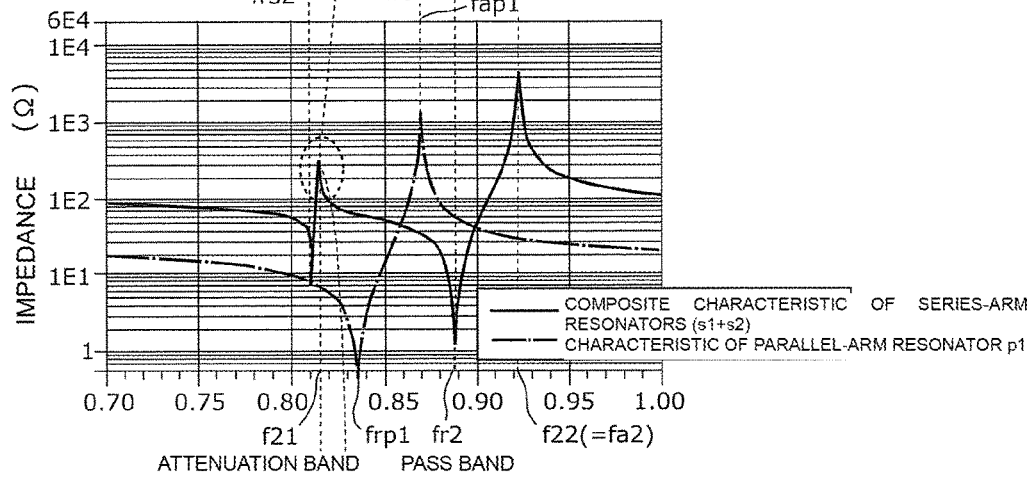
Figure 7C:
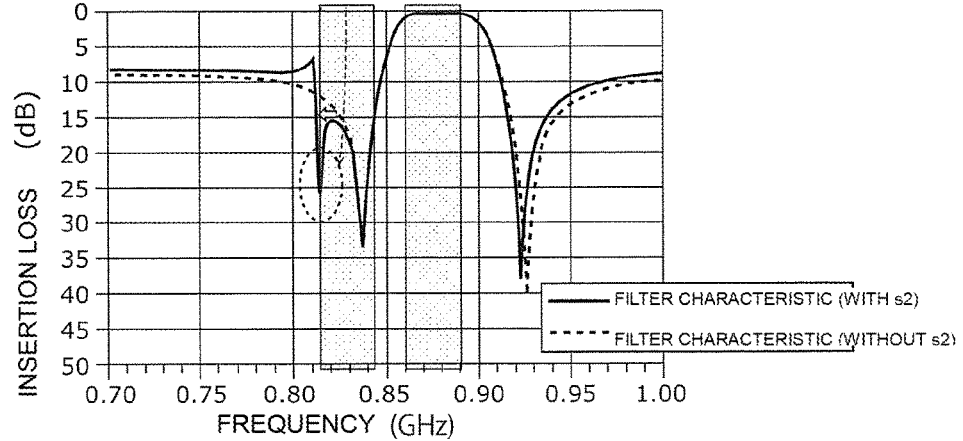

FIGS. 7A, 7B and 7C include graphs illustrating the characteristics of the filter 12 according to the first modification example of the first embodiment. Specifically, FIG. 7A is a graph illustrating the impedance characteristics of the series-arm resonators s1 and s2. FIG. 7B is a graph illustrating the composite impedance characteristic (composite characteristic) of the series-arm resonators s1 and s2. FIG. 7C is a graph illustrating the comparison between the filter characteristic of the filter 12 (second filter characteristic, "filter characteristic (with s2)" in the figure) and a filter characteristic when the series-arm resonator s2 is not included (first filter characteristic, "filter characteristic (without s2)" in the figure).

First, the impedance characteristic of a resonator alone will be described with reference to FIG. 7A.

As illustrated in FIG. 7A, the series-arm resonator s1 and the series-arm resonator s2 have the following impedance characteristics. Specifically, the series-arm resonator s1 has the resonant frequency frs1 and the anti-resonant frequency fas1 (at this time, frs1<fas1 is satisfied). The series-arm resonator s2 has a resonant frequency frs2 and an anti-resonant frequency fas2 (at this time, frs2<fas2 and frs2<frs1 are satisfied). In addition, the parallel-arm resonator p1 has the resonant frequency frp1 and the anti-resonant frequency fap1 (at this time, frs2<frp1<fap1 is satisfied). In addition, an impedance |Z(s1)| of the series-arm resonator s1 and an impedance |Z(s2)| of the series-arm resonator s2 satisfy |Z(s1)|<|Z(s2)|.

Next, a description will be given of the composite characteristic of the series-arm resonator s1 and the series-arm resonator s2 (i.e., the impedance characteristic of the series-arm circuit 110).

As illustrated in FIG. 7B, the composite characteristic of the two series-arm resonators s1 and s2 ("composite characteristic of series-arm resonators (s1+s2)" in FIG. 7B) is minimum at the resonant frequency frs2 of the series-arm resonator s2 and the resonant frequency frs1 of the series-arm resonator s1. In addition, the composite characteristic is maximum at a frequency f21 between the resonant frequency frs2 and the anti-resonant frequency fas2 and at a frequency f22 between the resonant frequency frs1 and the anti-resonant frequency fas1.

In the case of configuring a bandpass filter having a ladder filter structure, an anti-resonant frequency of a parallel-arm circuit and a resonant frequency of a series-arm circuit are set to be close to each other. In the present modification example, the anti-resonant frequency fap1 of the parallel-arm resonator p1 constituting the parallel-arm circuit 120 and the resonant frequency frs1, which is the higher of the two resonant frequencies of the series-arm circuit 110, are set to be close to each other, thereby forming a pass band.

Accordingly, as illustrated in FIG. 7C, an attenuation band including f21 and frp1 as attenuation poles is formed on the low band side of the pass band.

Here, as described above, the series-arm resonator s2, which is the second resonator in the present modification example, has a resonant frequency lower than that of the series-arm resonator s1, which is the first resonator in the present modification example. Thus, f21<frp1 is satisfied in the present modification example. Thus, in the filter characteristic of the filter 12 including the series-arm resonator s2, the attenuation band on the low band side of the pass band is wider than in the filter characteristic when the series-arm resonator s2 is not included.

Specifically, a filter not including the series-arm resonator s2 has only a first attenuation pole (frequency frp1) that is formed by the resonant point of the parallel-arm resonator p1. In such a filter, the amount of attenuation decreases on the low band side of the first attenuation pole, and thus there is a possibility that sufficient attenuation is not ensured within the attenuation band.

In contrast, the filter 12 according to the present modification example including the series-arm resonator s2 has a second attenuation pole (frequency f21) that is formed by the resonant point and the anti-resonant point of the series-arm resonator s2, on the low band side of the first attenuation pole (frequency frp1). Thus, compared with the filter not including the series-arm resonator s2, the filter 12 according to the present modification example is able to maintain the amount of attenuation on the low band side of the first attenuation pole by using the second attenuation pole, and is thus able to ensure sufficient attenuation within the attenuation band.

In addition, as described above, the series-arm resonator s2 serving as the second resonator in the present modification example has an impedance higher than that of the series-arm resonator s1 serving as the first resonator in the present modification example. Accordingly, the filter 12 is able to widen the attenuation band on the low band side of the pass band and to increase the steepness on the high band side of the pass band, while suppressing an increase in insertion loss at the higher end of the pass band. Specifically, with this configuration, a frequency interval |fr2−fa2| between a high-band-side frequency (high-band-side resonant frequency fr2) at which the impedance of the series-arm circuit 110 (here, the composite impedance of the series-arm resonators s1 and s2) is minimum and a high-band-side frequency (high-band-side anti-resonant frequency fa2) at which the impedance of the series-arm circuit 110 is maximum can be made narrower than a frequency interval |frs1−fas1| between the resonant frequency frs1 and the anti-resonant frequency fas1 of the series-arm resonator s1 alone. Accordingly, in the present modification example, the steepness on the high band side of the pass band can be increased. This will be described below by using a filter according to a second comparative example.

The filter according to the second comparative example has the same configuration as the filter 12 according to the first modification example of the first embodiment except that the filter includes a series-arm resonator s2 that satisfies |Z(s1)|≥|Z(s2)|.

Figure 8A:
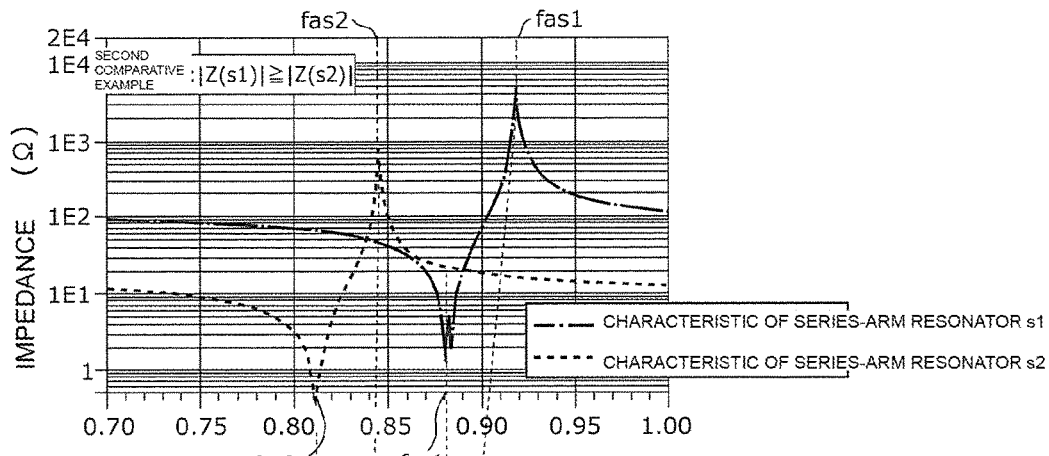
FIGS. 8A, 8B and 8C include graphs illustrating the characteristics of a filter according to a second comparative example.
Figure 8B:
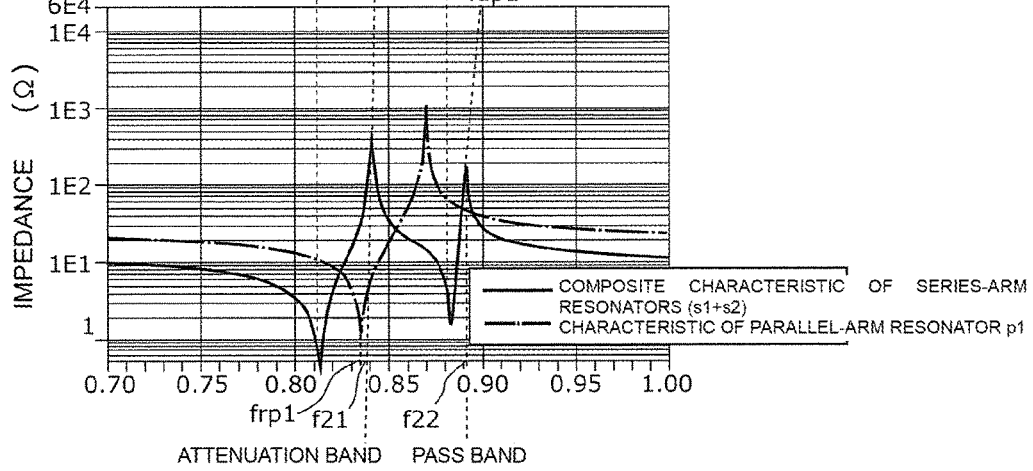
Figure 8C:
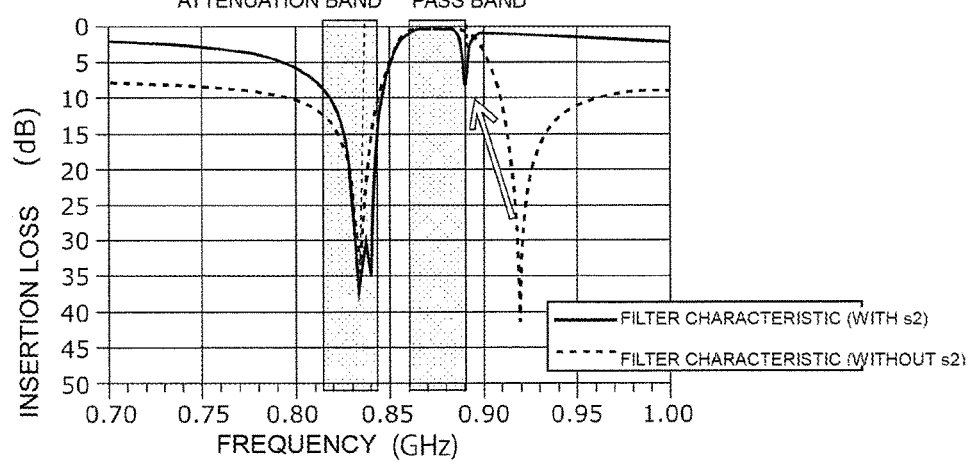

FIGS. 8A to 8C include graphs illustrating the characteristics of the filter according to the second comparative example. Specifically, FIGS. 8A to 8C are graphs illustrating individual characteristics of the filter according to the second comparative example, like FIGS. 7A to 7C.

As illustrated in FIG. 8A, |Z(s1)|≥|Z(s2)| (in FIG. 8A, |Z(s1)|>|Z(s2)|) is satisfied in the second comparative example, unlike in the first modification example of the first embodiment.

As is clear from the comparison between FIG. 8B and FIG. 7B, in the composite characteristic, the anti-resonant point on the high band side of the two anti-resonant points is at a lower frequency and the impedance is lower in the second comparative example than in the foregoing modification example.

Thus, as illustrated in FIG. 8C, on the high band side of the pass band, the attenuation pole on the high band side of the pass band is at a lower frequency and the amount of attenuation is smaller, in the second comparative example than in the foregoing modification example. That is, in the second comparative example, as in the first comparative example, the insertion loss at the higher end of the pass band increases. Thus, in the second comparative example, it is not possible to ensure the amount of attenuation in the attenuation band on the high band side of the pass band, and another problem of larger in-band loss arises on the high band side of the pass band.

In contrast, in the filter 12 according to the first modification example of the first embodiment, |Z(s1)|<|Z(s2)| is satisfied, and thus it is possible to ensure the amount of attenuation in the attenuation band on the high band side of the pass band and to suppress an increase in in-band loss on the high band side of the pass band.

FIGS. 9A to 9F include graphs illustrating the comparisons between the characteristics of the filter 12 according to the first modification example of the first embodiment with various impedance ratios of the series-arm resonator s2 to the series-arm resonator s1 and the characteristics of the filter not including the series-arm resonator s2. Specifically, FIGS. 9A to 9F are graphs illustrating the characteristics when |Z(s2)| is 5000%, 3000%, 2000%, 1000%, 500%, and 250% of |Z(s1)|, as denoted at the top of the individual graphs.

As illustrated in FIGS. 9A to 9F, on the low band side of the pass band, the bandwidth of the attenuation band on the low band side of the pass band decreases and the attenuation pole on the high band side of the pass band shifts to the low band side with the amount of attenuation being decreased in the filter characteristic, as the impedance ratio of the series-arm resonator s2 to the series-arm resonator s1 decreases. This is because, as the impedance ratio decreases, the anti-resonant point on the low band side shifts to the high band side with the impedance being increased, and the anti-resonant point on the high band side shifts to the low band side with the impedance being decreased, in the composite impedance characteristic of the series-arm resonators s1 and s2. However, even when the impedance ratio decreases, the frequency f21 (see FIGS. 8A to 8C) of the attenuation pole on the low band side satisfies f21<frp1. That is, even when the impedance ratio decreases, the second attenuation pole can be formed on the low band side of the first attenuation pole (frequency frp1) when frs2<frs1 is satisfied. Accordingly, the bandwidth of the attenuation band on the low band side of the pass band can be increased.

As illustrated in FIGS. 9A to 9F, on the high band side of the pass band, it is understood that an increase in insertion loss at the higher end of the pass band is suppressed compared with the second comparative example when |Z(s1)|<|Z(s2)| is satisfied even when the impedance ratio decreases.

Thus, the resonant frequency frs2 of the series-arm resonator s2 and the impedance ratio of the series-arm resonator s2 to the series-arm resonator s1 may be appropriately determined in consideration of the filter characteristics required for the filter 12.

As described above, in the filter 12 according to the present modification example, the series-arm circuit 110 is constituted by the series-arm resonator s1 serving as the first resonator and the series-arm resonator s2 serving as the second resonator. Here, the series-arm resonator s2 has a resonant frequency lower than that of the series-arm resonator s1 and also has an impedance higher than that of the series-arm resonator s1. Accordingly, the filter 12 is able to form an attenuation pole on the low band side of the pass band at a lower frequency than in the case of not using the series-arm resonator s2, while suppressing an increase in insertion loss at the higher end of the pass band. Thus, in the filter 12 according to the present modification example, the bandwidth of the attenuation band on the low band side of the pass band can be increased as in the first embodiment.

Specifically, in the present modification example, the series-arm circuit 110 includes the series-arm resonator s2 that has the resonant frequency frs2 lower than the resonant frequency frs1 of the series-arm resonator s1 and has the impedance |Z(s2)| higher than the impedance |Z(s1)| of the series-arm resonator s1. Accordingly, the filter 12 is able to form the second attenuation pole on the low band side of the first attenuation pole formed by the resonant frequency frp1 of the parallel-arm resonator p1 (parallel-arm circuit 120) while suppressing an increase in insertion loss at the higher end of the pass band. Accordingly, the bandwidth of the attenuation band on the low band side of the pass band can be increased.

In addition, in the present modification example, the series-arm resonator s2 has the resonant frequency frs2 lower than the anti-resonant frequency fap1 of the resonator constituting the parallel-arm circuit 120 (in the present modification example, the parallel-arm resonator p1). Accordingly, a decrease in the amount of attenuation between the attenuation poles on the low band side of the pass band can be suppressed, and thus the attenuation in the attenuation band on the low band side of the pass band can be ensured.

Second Modification Example of First Embodiment

In the first embodiment and its first modification example, one of the series-arm circuit and the parallel-arm circuit is constituted by the first resonator and the second resonator. Alternatively, each of the series-arm circuit and the parallel-arm circuit may be constituted by these resonators. In the first embodiment and its first modification example, a description has been given of a filter having invariable pass band frequencies or the like (fixed filter). However, the above-described configuration may be applied to a filter having a frequency change function in which pass band frequencies or the like are variable (tunable filter). Hereinafter, such a filter will be described as a filter according to a second modification example of the first embodiment.

Figure 10:
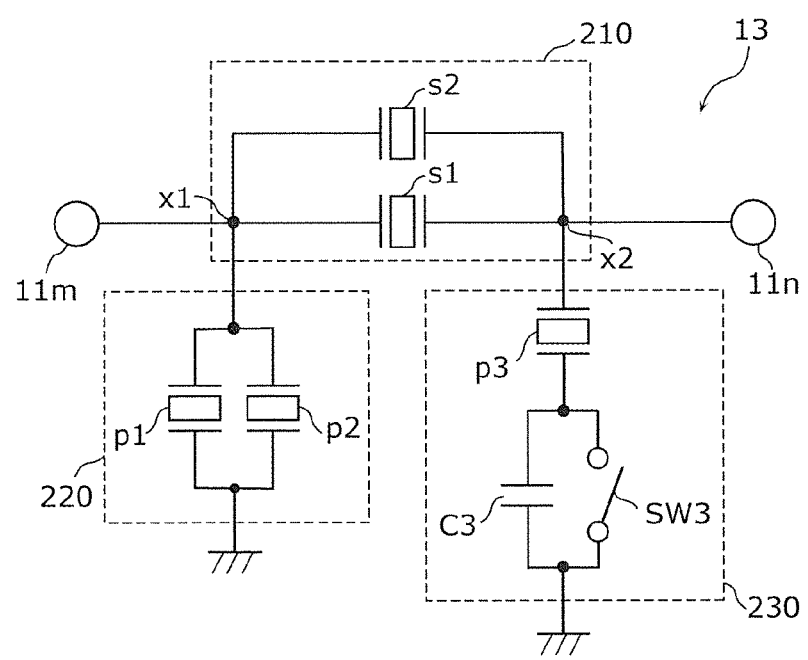
FIG. 10 is a circuit configuration diagram of a filter according to a second modification example of the first embodiment.

FIG. 10 is a circuit configuration diagram of a filter 13 according to the second modification example of the first embodiment.

The filter 13 illustrated in FIG. 10 includes a series-arm circuit 210 corresponding to the series-arm circuit 110 (the series-arm resonators s1 and s2) of the filter 12 illustrated in FIG. 6, and a parallel-arm circuit 220 corresponding to the parallel-arm circuit 20 (the parallel-arm resonators p1 and p2) of the filter 11 illustrated in FIG. 1. That is, in the filter 13, one of the series-arm circuit 210 and the parallel-arm circuit 220 (for example, the parallel-arm circuit 220) is constituted by a first resonator (for example, the parallel-arm resonator p1) and a second resonator (for example, the parallel-arm resonator p2) that are connected in parallel to each other and connected to the node x1 (first node). The other circuit (for example, the series-arm circuit 210) is constituted by a third resonator (for example, the series-arm resonator s1) and a fourth resonator (for example, the series-arm resonator s2) that are connected in parallel to each other and connected to the node x1.

The filter 13 further includes a parallel-arm circuit 230 constituted by a parallel-arm resonator p3, a capacitor C3 (second impedance element), and a switch SW3.

The parallel-arm resonator p3 is connected between the ground and a node x2 (second node) different from the node x1 (first node) on the path (series arm) that connects the input/output terminal 11m, which is an example of the first input/output terminal, and the input/output terminal 11n, which is an example of the second input/output terminal.

The capacitor C3 and the switch SW3 are each connected in series to the parallel-arm resonator p3 between the node x2 and the ground and are connected in parallel to each other. That is, in the present modification example, a circuit in which the capacitor C3 and the switch SW3 are connected in parallel to each other is connected in series to the parallel-arm resonator p3 between the node x2 and the ground, and specifically, is connected between the ground and the parallel-arm resonator p3. Alternatively, the capacitor C3 and the switch SW3 may be connected between the node x2 and the parallel-arm resonator p3.

The capacitor C3 is an impedance element connected in series to the parallel-arm resonator p3. The frequency variable width of the pass band of the filter 13 depends on the constant of the capacitor C3, for example, the frequency variable width increases as the constant of the capacitor C3 decreases. Thus, the constant of the capacitor C3 may be appropriately determined in accordance with the frequency specifications required for the filter 13. The capacitor C3 may be a variable capacitor such as a varicap or a digitally tunable capacitor (DTC). This enables the frequency variable width to be finely adjusted. Accordingly, the bandwidth of the attenuation band on the low band side of the pass band can be increased, and the lower end and the higher end of the attenuation band can be finely adjusted.

The impedance element connected in series to the parallel-arm resonator p3 is not limited to a capacitor and may be an inductor. In this case, the frequency variable width of the pass band of the filter 13 depends on the constant of the inductor, for example, the frequency variable width increases as the constant of the inductor increases. Thus, the constant of the inductor may be appropriately determined in accordance with the frequency specifications required for the filter 13. The inductor may be a variable inductor using micro electro mechanical systems (MEMS).

The switch SW3 is a switch element of a single pole single throw (SPST) type, for example, including one terminal connected to the connection node between the parallel-arm resonator p3 and the capacitor C3 and the other terminal connected to the ground. The switch SW3 is turned ON/OFF in accordance with a control signal from an external control unit (not illustrated), for example, and thereby switching whether or not to short-circuit the capacitor C3.

For example, the switch SW3 is a field effect transistor (FET) switch made of GaAs or complementary metal oxide semiconductor (CMOS) or a diode switch. Such a switch using semiconductor is compact, and thus the filter 13 can be decreased in size.

The filter characteristic of the filter 13 having the above-described configuration is switched in accordance with switching between ON and OFF of the switch SW3 caused by a control signal. Hereinafter, the filter characteristic of the filter 13, together with the state of the switch SW3, will be described with reference to FIGS. 11A to 11E.

Figure 11A:
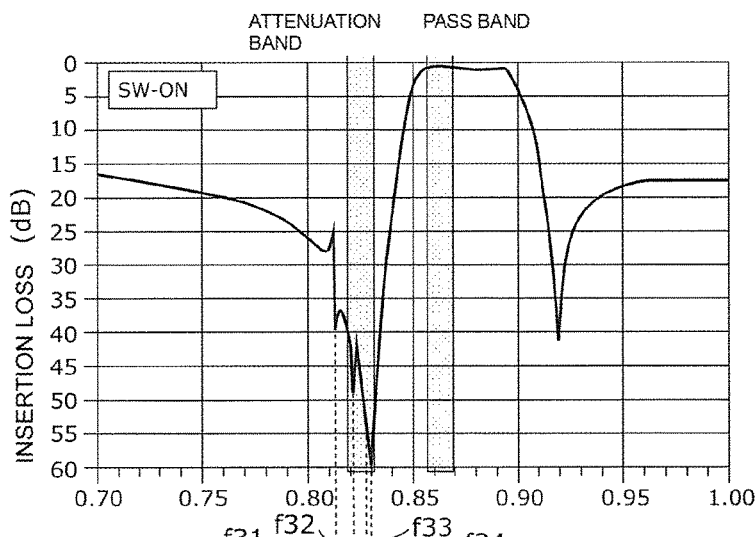
Figure 11B:
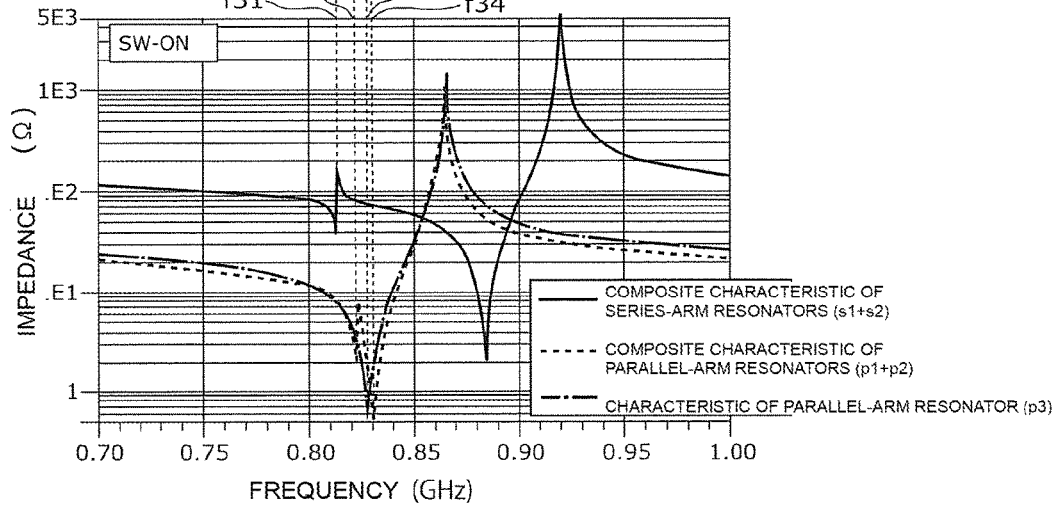
Figure 11E:
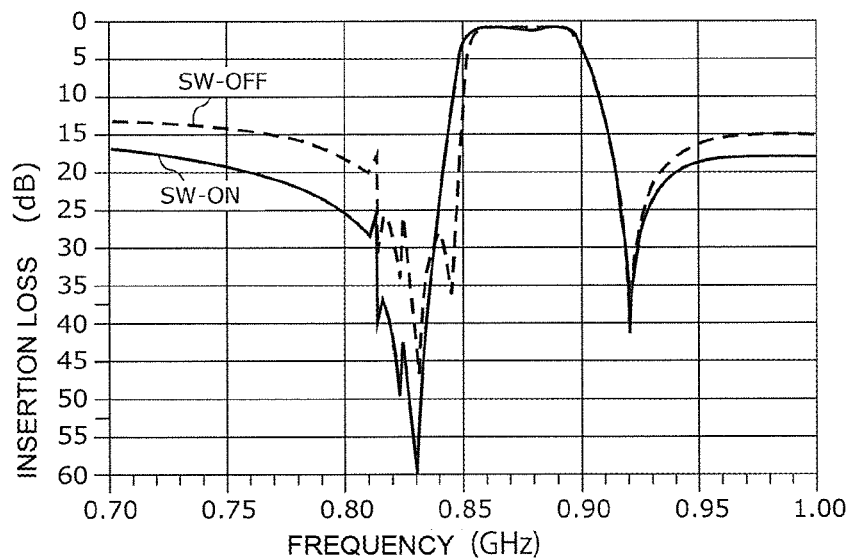
FIG. 11E is a graph illustrating the comparison between the filter characteristic of the filter according to the second modification example of the first embodiment when the switch is ON and the filter characteristic of the filter when the switch is OFF.

FIGS. 11A and 11B include graphs illustrating the characteristics of the filter 13 according to the second modification example of the first embodiment when the switch SW3 is ON. Specifically, FIG. 11A is a graph illustrating the filter characteristic at this time. FIG. 11B is a graph illustrating the composite impedance characteristic (composite characteristic) of the series-arm resonators s1 and s2 at this time, the composite impedance characteristic (composite characteristic) of the parallel-arm resonators p1 and p2, and the impedance characteristic of the parallel-arm resonator p3. FIGS. 11C and 11D include graphs illustrating the characteristics of the filter 13 according to the second modification example of the first embodiment when the switch SW3 is OFF. Specifically, FIGS. 11C and 11D are graphs illustrating the filter characteristic and impedance characteristics at this time, like FIGS. 11A and 11B. At this time, since the capacitor C3 is added to the parallel-arm resonator p3, the composite impedance characteristic of the parallel-arm resonator p3 and the capacitor C3 is illustrated. FIG. 11E is a graph illustrating the comparison between the filter characteristic of the filter 13 according to the second modification example of the first embodiment when the switch SW3 is ON and the filter characteristic of the filter 13 when the switch SW3 is OFF.

As illustrated in FIGS. 11A and 11B, when the switch SW3 is ON, the filter 13 has the following three attenuation poles in addition to the attenuation pole on the high band side of the pass band of the filter constituted by the series-arm resonator s1 and the attenuation pole on the low band side of the pass band of the filter constituted by only the parallel-arm resonator p1 (frequency f34, i.e., the resonant frequency frp1 of the parallel-arm resonator p1). The frequencies of these three attenuation poles are (i) a frequency f31, which is the anti-resonant frequency on the low band side of the series-arm circuit (the series-arm resonators s1 and s2), that is, the resonant frequency frs2 of the series-arm resonator s2, (ii) a frequency f32 (frp2), which is the resonant frequency on the low band side of the parallel-arm circuit (the parallel-arm resonators p1 and p2), and (iii) a frequency f33, which is the resonant frequency of the parallel-arm resonator p3 alone.

These frequencies (i) to (iii) are lower than (iv) the frequency f34 of the attenuation pole on the low band side of the pass band of the filter constituted by only the series-arm resonator s1 and the parallel-arm resonator p1. Thus, when the switch SW3 is ON, further attenuation can be ensured in the attenuation band on the low band side of the pass band, and thus the attenuation band on the low band side of the pass band can be further widened.

That is, when the switch SW3 is ON, the filter 13 has a first filter characteristic in which the attenuation band on the low band side of the pass band is determined by the attenuation poles having the foregoing frequencies (i) to (iv), the pass band is determined by the high-band-side resonant frequency of the series-arm circuit 210, the high-band-side anti-resonant frequency of the parallel-arm circuit 220, and the anti-resonant frequency of the parallel-arm resonator p3 alone, and the attenuation band on the high band side of the pass band is determined by the high-band-side anti-resonant frequency of the series-arm circuit 210.

On the other hand, when the switch SW3 is OFF, the filter 13 is affected by the capacitor C3 and thus has a second filter characteristic different from the first filter characteristic, as illustrated in FIGS. 11C and 11D. Specifically, the filter 13 has the following attenuation pole instead of the attenuation pole of the above-described frequency f33. The frequency of this attenuation pole is (v) a frequency f35 at which the composite impedance of the parallel-arm resonator p3 and the capacitor C3 is minimum. By adding the capacitor C3 to the parallel-arm resonator p3, the resonant frequency shifts to a higher frequency, and a relationship of f33<f35 is established.

That is, when the switch SW3 is OFF, compared with when the switch SW3 is ON, the filter 13 has the second filter characteristic in which the attenuation band on the low band side of the pass band is determined by the attenuation poles having the foregoing frequencies (i), (ii), (iv), and (v).

Here, the frequency f35 is determined by the constant of the capacitor C3, and f34<f35 is satisfied in the present modification example. Thus, in the present modification example, the higher end of the attenuation band on the low band side of the pass band is shifted to the high band side in the second filter characteristic, compared with the first filter characteristic.

That is, as illustrated in FIG. 11E, in the present modification example, the frequency of the lower end of the attenuation band is not shifted and maintained in the second filter characteristic, compared with the first filter characteristic. This is because the attenuation poles having the foregoing frequencies (i), (ii), and (iv) are not shifted in the first filter characteristic and the second filter characteristic.

As described above, in the filter 13 according to the present modification example, the parallel-arm circuit 220 is constituted by the parallel-arm resonator p1 serving as the first resonator and the parallel-arm resonator p2 serving as the second resonator, and the series-arm circuit 210 is constituted by the series-arm resonator s1 serving as the third resonator and the series-arm resonator s2 serving as the fourth resonator. Accordingly, further attenuation can be ensured in the attenuation band on the low band side of the pass band, and thus the bandwidth of the attenuation band on the low band side of the pass band can be further increased.

Specifically, when one of a series-arm circuit and a parallel-arm circuit is constituted by a first resonator and a second resonator and the other is constituted by one resonator, the following problem may arise although the bandwidth of the attenuation band on the low band side of the pass band can be increased. That is, in the attenuation band, the amount of attenuation between the attenuation poles significantly decreases (see, for example, the portion enclosed in the broken line in FIG. 3C), and it may be impossible to ensure the amount of attenuation.

In contrast to such a configuration, in the present modification example, more attenuation poles can be formed within the attenuation band on the low band side of the pass band. Thus, a decrease in the amount of attenuation between the attenuation poles can be suppressed, and the amount of attenuation can be ensured.

In the present modification example, the first resonator and the second resonator constitute the parallel-arm circuit 220, and the third resonator and the fourth resonator constitute the series-arm circuit 210. However, this relationship may be reversed, that is, the first resonator and the second resonator may constitute the series-arm circuit 210, and the third resonator and the fourth resonator may constitute the parallel-arm circuit 220.

In addition, regarding a filter having a typical frequency change function, there has been suggested a configuration in which whether or not to add a capacitor to a parallel-arm resonator is switched in accordance with switching between ON and OFF of a switch element, thereby shifting the attenuation pole on the low band side of the pass band to the high band side to change the frequencies of the attenuation band on the low band side of the pass band. However, in such a configuration, the impedance at the resonant point of the parallel-arm circuit increases when a capacitor is added (when the switch element is OFF), and thus it is difficult to ensure the amount of attenuation on the low band side of the resonant point (i.e., the low band side of the attenuation pole on the low band side of the pass band). In addition, since the amount of attenuation decreases on the low band side of the resonant point, it may be impossible to ensure sufficient attenuation within the attenuation band.

In contrast, the filter 13 according to the present modification example includes the parallel-arm resonator p3, and an impedance element (in the present modification example, the capacitor C3) and a switch element (the switch SW3) that are connected in series to the parallel-arm resonator p3 and that are connected in parallel to each other, in addition to the first resonator and the second resonator. Accordingly, it is possible to switch the filter characteristic in accordance with switching between ON and OFF of the switch element while increasing the bandwidth of the attenuation band on the low band side of the pass band.

Specifically, when the switch element is ON, the impedance element is short-circuited, and thus the attenuation band in the first filter characteristic is determined by a plurality of attenuation poles not affected by the impedance element (in the present modification example, four attenuation poles (frequencies f31 to f34)). On the other hand, when the switch element is OFF, the impedance element is not short-circuited, and thus the attenuation band in the second filter characteristic is determined by one or more attenuation poles each having a shifted frequency affected by the impedance element (in the present modification example, one attenuation pole (frequency f35)) and one or more attenuation poles each having a fixed frequency not affected by the impedance element (in the present modification example, three attenuation poles (frequencies f31, f32, and f34)). Thus, a decrease in the amount of attenuation can be suppressed on the low band side of the frequency-shifted attenuation pole by using an attenuation pole having a fixed frequency, and thus sufficient attenuation can be ensured within the attenuation band. That is, the bandwidth of the attenuation band on the low band side of the pass band can be increased and the filter characteristic can be switched.

The impedance element and the switch element need not necessarily be provided. In a filter having such a configuration, although it is impossible to switch the filter characteristic, one of the series-arm circuit 210 and the parallel-arm circuit 220 is constituted by the first resonator and the second resonator, and the other is constituted by the third resonator and the fourth resonator. In the filter having such a configuration, as in the filter 13 according to the present modification example, the attenuation band on the low band side of the pass band can be further widened, compared with the filters 11 and 12.

Second Embodiment

The RF filter circuits described in the first embodiment and its first and second modification examples are applicable to an RF front-end circuit. In the present embodiment, a description will be given of such an RF front-end circuit.

Figure 12:
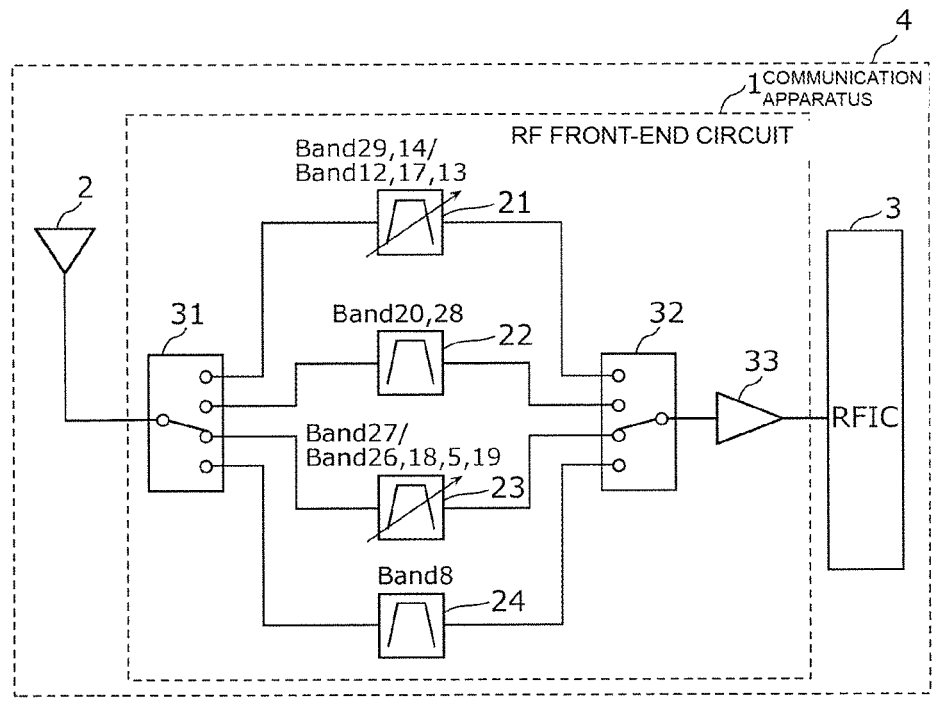
FIG. 12 is a configuration diagram of a radio-frequency (RF) front-end circuit and its peripheral circuit according to a second embodiment.

FIG. 12 is a configuration diagram of an RF front-end circuit 1 and its peripheral circuit according to the second embodiment. FIG. 12 illustrates an antenna element 2, the RF front-end circuit 1, and an RF signal processing circuit (radio frequency integrated circuit (RFIC)) 3. These components constitute, for example, a communication apparatus 4 supporting multi-modes and multi-bands. The antenna element 2 need not necessarily be built in the communication apparatus 4 and may be externally attached thereto.

The antenna element 2 is an antenna that transmits and receives RF signals and that supports multi-bands. The antenna element 2 need not necessarily support all the bands of the communication apparatus 4, for example, and may support only the bands in a low-frequency band group or a high-frequency band group.

The RF front-end circuit 1 is a circuit that transmits RF signals between the antenna element 2 and the RFIC 3. Specifically, the RF front-end circuit 1 transmits an RF signal (here, an RF reception signal) received by the antenna element 2 to the RFIC 3. The detailed configuration of the RF front-end circuit 1 will be described below.

The RFIC 3 is an RF signal processing circuit that processes RF signals transmitted/received by the antenna element 2. Specifically, the RFIC 3 performs signal processing, such as down-converting, on an RF signal (here, an RF reception signal) received from the antenna element 2 through a reception-side signal path of the RF front-end circuit 1, and outputs a reception signal generated through the signal processing to a baseband signal processing circuit (not illustrated).

In the present embodiment, the RFIC 3 also functions as a control unit that controls ON and OFF of each switch included in the RF front-end circuit 1, based on a frequency band that is used. Specifically, the RFIC 3 controls ON/OFF of each switch in accordance with a control signal (not illustrated). The control unit may be provided outside the RFIC 3, for example, in the RF front-end circuit 1 or in a baseband signal processing circuit (not illustrated).

Next, a description will be given of the detailed configuration of the RF front-end circuit 1.

As illustrated in FIG. 12, the RF front-end circuit 1 includes filters 21 to 24, switches 31 and 32, and a reception amplifier circuit 33.

Among the filters 21 to 24, the filters 21 and 23 are tunable filters each having a switchable pass band, and the filters 22 and 24 are fixed filters each having a non-switchable pass band. Specifically, the filter 21 is a reception filter for Band 29 and Band 14 (or Band 12, Band 17, and Band 13). The filter 22 is a reception filter for Band 20 and Band 28. The filter 23 is a reception filter for Band 27 (or Band 26, Band 18, Band 5, and Band 19). The filter 24 is a reception filter for Band 8.

The switch 31 connects the antenna element 2 and a signal path corresponding to a predetermined band in accordance with a control signal from a control unit (not illustrated) such as an RFIC. The switch 32 connects the reception amplifier circuit 33 and a signal path corresponding to a predetermined band in accordance with a control signal. These switches 31 and 32 are, for example, switch elements (switch circuits) of a single pole n throw (SPnT) type (n represents the number of signal paths, here, 4). That is, the switches 31 and 32 each include a plurality of selection terminals individually connected to the plurality of filters 21 to 24 and a common terminal that is selectively connected to the plurality of selection terminals.

The number of signal paths connected through the switches 31 and 32 is not limited to one, and a plurality of signal paths may be connected. That is, the RF front-end circuit 1 may support carrier aggregation.

The reception amplifier circuit 33 is a low-noise amplifier that amplifies the power of RF reception signals received from the filters 21 to 24 via the switch 32 and outputs the RF reception signals to the RFIC 3.

In the RF front-end circuit 1 having the above-described configuration, for example, the filter 23 has the configurations described in the first embodiment and its modification examples.

Figure 13:
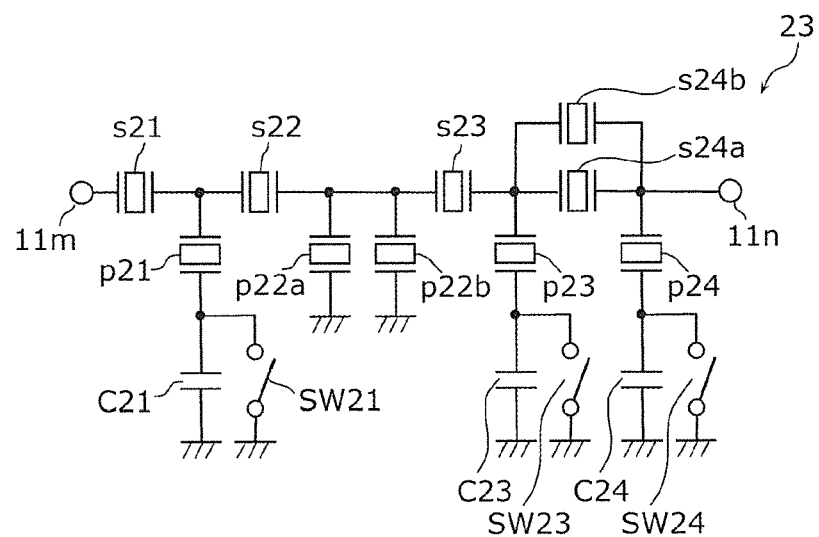
FIG. 13 is a circuit configuration diagram of a filter that is used in the RF front-end circuit according to the second embodiment.

FIG. 13 is a circuit configuration diagram of the filter 23 that is used in the RF front-end circuit 1 according to the second embodiment.

As illustrated in FIG. 13, the filter 23 includes five series-arm resonators s21 to s23, s24a, and s24b, and five parallel-arm resonators p21, p22a, p22b, p23, and p24. The filter 23 further includes capacitors C21, C23, and C24 and switches SW21, SW23, and SW24.

The series-arm resonators s21 to s23, s24a, and s24b are connected in series to each other in this order from the input/output terminal 11m on the path (series arm) that connects the input/output terminal 11m and the input/output terminal 11n. Among these series-arm resonators, the series-arm resonators s24a and s24b correspond to the first resonator and the second resonator in the first modification example of the first embodiment, and are connected in parallel to each other and connected to the same node of the series arm. That is, each of the series-arm resonators s21 to s23 constitutes one series-arm circuit, and the series-arm resonators s24a and s24b constitute one series-arm circuit.

The parallel-arm resonators p21, p22a, p22b, p23, and p24 are connected in parallel to each other in this order from the input/output terminal 11m on the paths (parallel arms) that connect the individual connection points of the foregoing series-arm resonators and the reference terminal (ground). Among these parallel-arm resonators, the parallel-arm resonators p22a and p22b correspond to the first resonator and the second resonator in the first embodiment, and are connected in parallel to each other and connected to the same node of the series arm.

The capacitor C21 and the switch SW21 correspond to the impedance element and the switch element in the second modification example of the first embodiment, and are connected in series to the parallel-arm resonator p21 and connected in parallel to each other. The capacitor C23 and the switch SW23, and the capacitor C24 and the switch SW24 also correspond to the impedance element and the switch element, and are connected to the parallel-arm resonator p23 and the parallel-arm resonator p24, respectively.

That is, the parallel-arm resonator p21, the capacitor C21, and the switch SW21 constitute one parallel-arm circuit. The parallel-arm resonators p22a and p22b constitute one parallel-arm circuit. The parallel-arm resonator p23, the capacitor C23, and the switch SW23 constitute one parallel-arm circuit. The parallel-arm resonator p24, the capacitor C24, and the switch SW24 constitute one parallel-arm circuit.

In this way, the filter 23 has a ladder filter structure including a plurality of series-arm circuits and a plurality of parallel-arm circuits (here, four series-arm circuits and four parallel-arm circuits).

In the filter 23, the number of series-arm resonators and parallel-arm resonators and the connection style thereof are not particularly limited. The structure of the filter 23 is not limited to a ladder filter structure including series-arm resonators and parallel-arm resonators, and may have a longitudinally coupled filter structure. That is, the structure of the filter 23 may be appropriately selected in accordance with the restrictions on packaging layout or required filter characteristics or the like.

In the present embodiment, the following characteristics are required for the filter 23. That is, the filter 23 is required to have a first filter characteristic in which the reception band of Band 27 corresponds to a pass band and the transmission band of Band 27 corresponds to an attenuation band, and a second filter characteristic in which the reception bands of Band 26, Band 18, Band 5, and Band 19 correspond to a pass band, and the transmission bands of Band 26, Band 18, Band 5, and Band 19 correspond to an attenuation band.

In general, however, when the attenuation band is relatively wide as in the second filter characteristic, it is difficult to ensure the amount of attenuation over the entire attenuation band, and thus it may be impossible to ensure a required width of the attenuation band.

In contrast, the filter 23 according to the present embodiment includes a first resonator and a second resonator constituting a series-arm circuit (in the present embodiment, the series-arm resonators s24a and s24b), and a first resonator and a second resonator constituting a parallel-arm circuit (in the present embodiment, the parallel-arm resonators p22a and p22b). Accordingly, the filter 23 is able to increase the bandwidth of the attenuation band on the low band side of the pass band, as in the first embodiment and its first modification example. Thus, the amount of attenuation can be ensured over the entire transmission bands of Band 26, Band 18, Band 5, and Band 19.

In addition, the filter 23 includes parallel-arm resonators (here, the parallel-arm resonators p21, p23, and p24), and also includes impedance elements (here, the capacitors C21, C23, and C24) and switch elements (here, the switches SW21, SW23, and SW24) that are connected in series to the respective parallel-arm resonators and that are connected in parallel to each other. Accordingly, the filter 23 is able to switch the filter characteristic in accordance with switching between ON and OFF of the switch element while increasing the bandwidth of the attenuation band on the low band side of the pass band, as in the second modification example of the first embodiment.

Specifically, when all the switches SW21, SW23, and SW24 are ON, the filter 23 has the foregoing first filter characteristic. At this time, the attenuation band in the first filter characteristic is determined by the attenuation poles not affected by the impedance elements (in the present embodiment, the capacitors C21, C23, and C24).

On the other hand, when all the switches SW21, SW23, and SW24 are OFF, the filter 23 has the foregoing second filter characteristic. At this time, the attenuation band in the second filter characteristic is determined by the attenuation poles affected by the impedance elements.

The RF front-end circuit 1, having the above-described configuration, includes the filter 23 (RF filter circuit) according to the first embodiment and its modification examples. Accordingly, the number of filters included therein can be reduced compared with the case where a filter is provided for each band, and thus reduction in size can be achieved.

Not only the filter 23, but also at least one of the filters 21, 22, and 24 may have the configurations of the filters according to the first embodiment and its modification examples.

In addition, the RF front-end circuit 1 according to the present embodiment includes the switches 31 and 32 (switch circuits) provided in the preceding stage or the subsequent stage of the plurality of filters 21 to 24 (RF filter circuits). With this configuration, some of the signal paths through which RF signals are transmitted can be used in common. Accordingly, for example, the reception amplifier circuit 33 (amplifier circuit) for the plurality of RF filter circuits can be used in common. As a result, the size and cost of the RF front-end circuit 1 can be reduced.

It is sufficient that at least one of the switches 31 and 32 be provided. The switches 31 and 32 need not necessarily support all the bands of the RF front-end circuit 1, for example, and switches individually supporting a low frequency band group or a high frequency group may be provided. That is, the number of selection terminals or the like of the switches 31 and 32 is not limited to that according to the present embodiment.

From the viewpoint of simplifying the configuration, it is preferable that the switch elements (switches SW21, SW23, and SW24) be turned ON/OFF by the same control signal. However, the configuration is not limited thereto, and the individual switch elements may be turned ON/OFF by individual control signals.

Other Embodiments

A description has been given above of the RF filter circuit and RF front-end circuit according to the embodiments of the present disclosure, using embodiments and modification examples, but the present disclosure is not limited to the above-described embodiments and modification examples. Another embodiment that is implemented by combining any components in the above-described embodiments and modification examples, a modification example that is obtained by applying various changes conceived of by a person skilled in the art to the above-described embodiments without deviating from the gist of the present disclosure, and various apparatuses including the RF filter circuit and RF front-end circuit according to the present disclosure are also included in the present disclosure.

For example, the communication apparatus 4 including the above-described RF front-end circuit 1 and RFIC 3 (RF signal processing circuit) is also included in the present disclosure. With the communication apparatus 4, a communication apparatus supporting multi-bands can be simplified and reduced in size. In addition, for example, a multiplexer, such as a duplexer, including a plurality of RF filter circuits including the above-described RF filter circuits is also included in the present disclosure.

In addition, for example, the above-described RF filter circuits are not limited to reception filters and may be transmission filters.

In addition, for example, in the RF front-end circuit or communication apparatus, an inductor or capacitor may be connected between individual components.

The RF filter circuits according to the first embodiment and its first and second modification examples are applicable to at least one RF filter circuit of a multiplexer including a plurality of RF filter circuits. Hereinafter, such a multiplexer will be described by using, as an example, a duplexer in which the above-described RF filter circuits are applied to a reception-side filter and a transmission-side filter.

Figure 14:
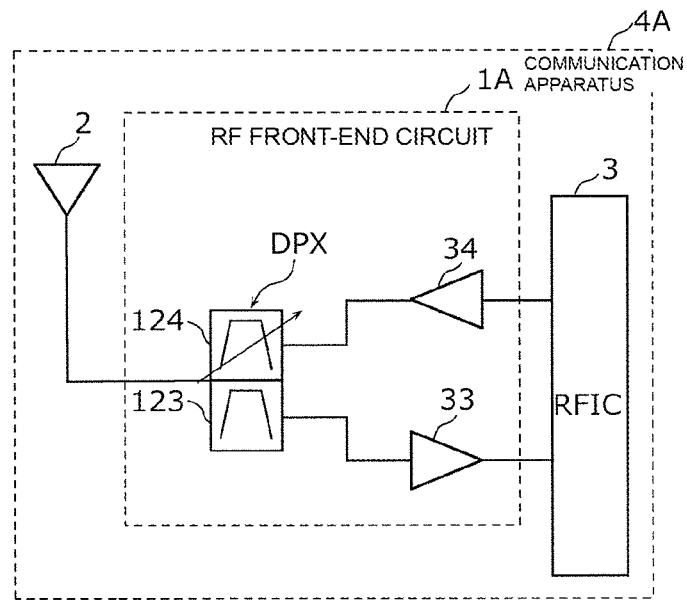
FIG. 14 is a configuration diagram of a communication apparatus including a duplexer according to another embodiment.

FIG. 14 is a configuration diagram of a communication apparatus 4A including a duplexer DPX according to another embodiment. As illustrated in FIG. 14, the duplexer DPX constitutes an RF front-end circuit 1A, together with the reception amplifier circuit 33 and a transmission amplifier circuit 34.

The duplexer DPX illustrated in FIG. 14 includes the filter 11 according to the first embodiment or the filter 12 according to the first modification example as a reception-side filter 123 and includes the filter 13 according to the second modification example of the first embodiment as a transmission-side filter 124. That is, the reception-side filter 123 and the transmission-side filter 124 each have an antenna-side input/output terminal connected to the antenna element 2, and the other terminal connected to the reception amplifier circuit 33 or the transmission amplifier circuit 34.

Such a multiplexer (here, the duplexer DPX), which includes the RF filter circuits according to the first embodiment and its first and second modification examples (here, the reception-side filter 123 and the transmission-side filter 124), is able to increase the bandwidth of the attenuation band on the low band side of the pass band for the multiplexer applied to a system supporting multi-bands.

The multiplexer is not limited to the duplexer, and may be, for example, a triplexer or the like including three RF filter circuits. In addition, the configuration of the multiplexer is not limited to a configuration including a transmission-side filter and a reception-side filter, and may be, for example, a configuration including a plurality of reception-side filters.

In the multiplexer, it is sufficient that the RF filter circuit according to the first embodiment and its first and second modification examples be applied to at least one of a plurality of filters. For example, the multiplexer may include a filter in which only one resonator is provided on each series arm and each parallel arm.

A description has been given of, as an example, the configurations of the RF filter circuits according to the first embodiment and its first and second modification examples including a series-arm circuit or parallel-arm circuit that is connected to the node x1 and that is constituted by only resonators. However, the series-arm circuit or parallel-arm circuit may further include an impedance element.

For example, one of the series-arm circuit and the parallel-arm circuit constituted by a first resonator and a second resonator may further include a first impedance element connected in series or parallel to the second resonator. At this time, the first resonator, the second resonator, and the first impedance element (typically the composite characteristic of these components) form a pass band together with the other circuit.

Accordingly, by appropriately selecting the first impedance element, it is possible to obtain another filter characteristic while increasing the bandwidth of the attenuation band on the low band side of the pass band.

For example, when a capacitor is provided as the first impedance element connected in parallel to the second resonator, the frequency interval between the resonant frequency and the anti-resonant frequency of the second resonator connected to the first impedance element can be made narrower than the frequency interval between the resonant frequency and the anti-resonant frequency of the second resonator alone. With this configuration, a steep attenuation characteristic can be obtained.

In addition, for example, when an inductor is provided as the first impedance element connected in series to the second resonator, the frequency interval between the resonant frequency and the anti-resonant frequency of the second resonator connected to the first impedance element can be made wider than the frequency interval between the resonant frequency and the anti-resonant frequency of the second resonator alone. With this configuration, a wide bandpass characteristic can be obtained (the pass band can be widened).

The other of the series-arm circuit and the parallel-arm circuit, different from the one circuit constituted by the first resonator and the second resonator, is not limited to a resonant circuit including a resonator, and may be an LC resonant circuit including an inductor and a capacitor. Furthermore, the other circuit is not limited to a resonant circuit, and may be an impedance element such as an inductor or a capacitor.

The present disclosure can be widely used for communication equipment such as a cellular phone, as a compact filter applicable to a multi-band system, a multiplexer, a front-end circuit, and a communication apparatus.

1, 1A radio-frequency front-end circuit
2 antenna element
3 RFIC (RF signal processing circuit)
4, 4A communication apparatus
10, 110, 210 series-arm circuit
11 to 13, 21 to 24 filter (radio-frequency filter circuit)
11a, 11b IDT electrode
11m input/output terminal (first input/output terminal)
11n input/output terminal (second input/output terminal)
20, 120, 220, 230 parallel-arm circuit
31, 32 switch (switch circuit)
33 reception amplifier circuit
34 transmission amplifier circuit
100 substrate
101 adhesive layer
102 main electrode layer
103 protective layer
110a, 110b electrode finger
111a, 111b busbar electrode
123 reception-side filter
124 transmission-side filter
C3, C21, C23, C24 capacitor (impedance element)
DPX duplexer
p1, p2, p3, p21, p22a, p22b, p23, p24 parallel-arm resonator
SW3, SW21, SW23, SW24 switch (switch element)
s1, s2, s21 to s23, s24a, s24b series-arm resonator

What is claimed is:

1. A radio-frequency filter circuit comprising:
a series-arm circuit disposed on a path connecting a first input/output terminal and a second input/output terminal; and
a parallel-arm circuit connected between ground and the path, wherein:
the series-arm circuit or the parallel-arm circuit comprises a first resonator and a second resonator that are connected in parallel to each other and to a first node on the path,
the series-arm circuit and the parallel-arm circuit form a pass band of the radio-frequency filter,
the second resonator has a resonant frequency lower than a resonant frequency of the first resonator,
the second resonator has an impedance greater than an impedance of the first resonator, and
the first and second resonators are in the parallel-arm circuit.

2. A radio-frequency front-end circuit comprising:
a plurality of radio-frequency filter circuits including the radio-frequency filter circuit according to claim 1; and
a switch circuit that includes a plurality of selection terminals individually connected to the plurality of radio-frequency filter circuits and a common terminal selectively connected to the plurality of selection terminals.

3. A communication apparatus comprising:
a radio-frequency signal processing circuit configured to process a radio-frequency signal transmitted or received by an antenna element; and
the radio-frequency front-end circuit according to claim 2, the radio-frequency front-end circuit being configured to transmit the radio-frequency signal between the antenna element and the radio-frequency signal processing circuit.

4. The radio-frequency filter circuit according to claim 1, wherein the series-arm circuit comprises a third resonator.

5. A multiplexer comprising:
a plurality of radio-frequency filter circuits including the radio-frequency filter circuit according to claim 1.

6. The radio-frequency filter circuit according to claim 1, wherein:
the series-arm circuit comprises a third resonator and a fourth resonator that are connected in parallel to each other,
the fourth resonator has a resonant frequency lower than a resonant frequency of the third resonator, and
the fourth resonator has an impedance greater than an impedance of the third resonator.

7. The radio-frequency filter circuit according to claim 1, wherein each of the first and second resonators is an elastic wave resonator that uses a surface acoustic wave, a bulk wave, or a boundary acoustic wave.

8. The radio-frequency filter circuit according to claim 1, wherein the parallel-arm circuit further comprises a first impedance element.

9. A radio-frequency filter circuit comprising:
a series-arm circuit disposed on a path connecting a first input/output terminal and a second input/output terminal;
a parallel-arm circuit connected between ground and the path;
a parallel-arm resonator connected between ground and a second node on the path; and
a second impedance element and a switch that are connected in series to the parallel-arm resonator and that are connected in parallel to each other, wherein:

the series-arm circuit or the parallel-arm circuit comprises a first resonator and a second resonator that are connected in parallel to each other and to a first node on the path, the series-arm circuit and the parallel-arm circuit form a pass band of the radio-frequency filter, the second resonator has a resonant frequency lower than a resonant frequency of the first resonator, and the second resonator has an impedance greater than an impedance of the first resonator.

10. The radio-frequency filter circuit according to claim 9, wherein the first and second resonators are in the parallel-arm circuit.

11. The radio-frequency filter circuit according to claim 9, wherein the switch is a field-effect transistor (FET) switch made of gallium arsenide (GaAs) or a complementary metal oxide semiconductor (CMOS), or a diode switch.

12. The radio-frequency filter circuit according to claim 11, wherein the second impedance element is a variable capacitor or a variable inductor.

13. The radio-frequency filter circuit according to claim 9, wherein the second impedance element is a variable capacitor or a variable inductor.

14. The radio-frequency filter circuit according to claim 9, wherein the first and second resonators are in the series-arm circuit.

15. The radio-frequency filter circuit according to claim 14, wherein the parallel-arm circuit comprises a third resonator, and the second resonator has a resonant frequency lower than an anti-resonant frequency of the third resonator.

16. The radio-frequency filter circuit according to claim 14, wherein the series-arm circuit further comprises a first impedance element.

17. The radio-frequency filter circuit according to claim 14, wherein:

the parallel-arm circuit comprises a third resonator and a fourth resonator that are connected in parallel to each other, the fourth resonator has a resonant frequency lower than a resonant frequency of the third resonator, and the fourth resonator has an impedance greater than an impedance of the third resonator.

18. A multiplexer comprising:

a plurality of radio-frequency filter circuits including the radio-frequency filter circuit according to claim 9.

19. A radio-frequency front-end circuit comprising:

a plurality of radio-frequency filter circuits including the radio-frequency filter circuit according to claim 9; and a switch circuit that includes a plurality of selection terminals individually connected to the plurality of radio-frequency filter circuits and a common terminal selectively connected to the plurality of selection terminals.

20. A communication apparatus comprising:

a radio-frequency signal processing circuit configured to process a radio-frequency signal transmitted or received by an antenna element; and the radio-frequency front-end circuit according to claim 19, the radio-frequency front-end circuit being configured to transmit the radio-frequency signal between the antenna element and the radio-frequency signal processing circuit.

* * * * *

UNITED STATES PATENT AND TRADEMARK OFFICE
CERTIFICATE OF CORRECTION

PATENT NO. : 10,819,310 B2
APPLICATION NO. : 16/251257
DATED : October 27, 2020
INVENTOR(S) : Atsushi Horita et al.

Page 1 of 1

It is certified that error appears in the above-identified patent and that said Letters Patent is hereby corrected as shown below:

On the Title Page

Related U.S. Application Data (60): "Provisional application No. PCT/JP2017/023707, filed Jun. 28, 2017." should read -- Continuation of International application No. PCT/JP2017/023707, Jun. 28, 2017. --

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*